United States Patent
Richter et al.

(10) Patent No.: US 10,877,097 B2
(45) Date of Patent: Dec. 29, 2020

(54) DC MONITORING SYSTEM FOR VARIABLE FREQUENCY DRIVES

(71) Applicant: Power Standard Labs, Inc., Alameda, CA (US)

(72) Inventors: Mark Richter, Orinda, CA (US); Robert Pompeani, Oakland, CA (US); Arya Bannazadeh-Mahani, Berkeley, CA (US); Edward Winterberger, Alameda, CA (US)

(73) Assignee: Power Standard Labs, Inc., Alameda, CA (US)

( * ) Notice: Subject to any disclaimer, the term of this patent is extended or adjusted under 35 U.S.C. 154(b) by 0 days.

(21) Appl. No.: 16/593,275

(22) Filed: Oct. 4, 2019

(65) Prior Publication Data

US 2020/0249277 A1    Aug. 6, 2020

Related U.S. Application Data

(60) Provisional application No. 62/802,134, filed on Feb. 6, 2019.

(51) Int. Cl.
*G01R 31/34* (2020.01)
*G01R 19/165* (2006.01)
(Continued)

(52) U.S. Cl.
CPC ..... *G01R 31/343* (2013.01); *G01R 19/16533* (2013.01); *G01R 19/16576* (2013.01);
(Continued)

(58) Field of Classification Search
None
See application file for complete search history.

(56) References Cited

U.S. PATENT DOCUMENTS

| | | | | |
|---|---|---|---|---|
| 4,442,385 A | * | 4/1984 | Van Sickle | H02J 9/066 |
| | | | | 310/113 |
| 4,586,118 A | * | 4/1986 | Mihalka | H02M 3/3376 |
| | | | | 363/17 |

(Continued)

FOREIGN PATENT DOCUMENTS

| | | |
|---|---|---|
| CN | 105850023 B | 9/2018 |
| JP | 2002165357 | 6/2002 |

(Continued)

OTHER PUBLICATIONS

International Search Report, dated May 22, 2020, International Application No. PCT/US2020/014540, 9 pages.

*Primary Examiner* — Bentsu Ro
(74) *Attorney, Agent, or Firm* — Haverstock & Owens LLP

(57) ABSTRACT

A DC monitoring system is configured to measure and analyze VFD (Variable Frequency Drive) operational characteristics. The VFD is configured to receive three-phase input power from a standardized source and to provide variable frequency three-phase output power to a three-phase motor. In some applications, the VFD and motor operate at a medium voltage. The VFD can include multiple inverter modules consisting of a DC section and switching section, also referred to as a multiple bus configuration. The DC monitoring system includes a measurement module coupled to each DC bus of the VFD, a data communication network, and a PQube monitoring device for transmitting data signals corresponding to voltage values of the VFD DC bus obtained in a medium voltage compartment to a low voltage compartment for processing and analysis. Processing of the data signals enables comparative and predictive analysis to determine early warning for possible capacitance failure in the VFD.

27 Claims, 15 Drawing Sheets

(51) Int. Cl.
  *H02M 7/5387* (2007.01)
  *H02P 27/06* (2006.01)
  *H04B 10/25* (2013.01)

(52) U.S. Cl.
  CPC ....... *G01R 19/16585* (2013.01); *G01R 31/34* (2013.01); *H02M 7/53871* (2013.01); *H02P 27/06* (2013.01); *H04B 10/25* (2013.01)

(56) References Cited

U.S. PATENT DOCUMENTS

| | | | | |
|---|---|---|---|---|
| 4,623,830 A | * | 11/1986 | Peneder | H02P 25/024 |
| | | | | 318/798 |
| 4,724,680 A | * | 2/1988 | Kawai | G05D 23/1917 |
| | | | | 62/115 |
| 5,705,904 A | * | 1/1998 | Kuriyama | H02M 1/32 |
| | | | | 318/400.21 |
| 5,828,200 A | * | 10/1998 | Ligman | H02H 7/0858 |
| | | | | 318/807 |
| 6,097,165 A | * | 8/2000 | Herron | B66B 1/32 |
| | | | | 188/162 |
| 9,653,984 B2 | | 5/2017 | Patel et al. | |
| 2011/0292696 A1 | | 12/2011 | Xiao et al. | |
| 2012/0271572 A1 | | 10/2012 | Xiao et al. | |
| 2014/0056042 A1 | | 2/2014 | Radosevich | |
| 2015/0177287 A1 | | 6/2015 | Baburaj | |
| 2016/0056750 A1 | * | 2/2016 | West | H02M 7/53871 |
| | | | | 318/490 |
| 2016/0239010 A1 | | 8/2016 | McDaniel et al. | |

FOREIGN PATENT DOCUMENTS

| | | |
|---|---|---|
| JP | 2007240450 | 9/2007 |
| JP | 2013050653 A | 3/2013 |
| KR | 1020030089902 | 11/2003 |
| KR | 100738751 B1 | 11/2013 |
| WO | WO2018227307 | 12/2018 |

* cited by examiner

DC MONITORING SYSTEM FOR VARIABLE FREQUENCY DRIVES

RELATED APPLICATIONS

This patent application claims priority under 35 U.S.C. 119(e) of the U.S. provisional patent applications, Application Ser. No. 62/802,134, filed on Feb. 6, 2019, and entitled "DC Monitoring System for Variable Frequency Drives", which is hereby incorporated in its entirety by reference.

FIELD OF THE INVENTION

The present invention is generally directed to the field of variable frequency drives. More specifically, the present invention is directed to a DC (direct current) monitoring system for variable frequency drives.

BACKGROUND OF THE INVENTION

Three-phase motors are commonly used in industrial applications. A preferred method for controlling the speed of a three-phase motor is to vary the voltage and frequency of a three-phase AC voltage input to the three-phase motor. A variable frequency drive (VFD) is a device that provides variable voltage and frequency to rotate a three-phase motor at any speed based on a control signal. The VFD can be controlled to adjust the voltage and frequency of a supplied three-phase AC voltage according to speed requirements of the three-phase motor. Common applications for VFDs are in pumps, blowers, conveyors, and induction generators in industries such as manufacturing, water treatment, desalination plants, paper mills, engine propulsion and HVAC.

A typical VFD operates by first changing an input three-phase AC voltage into DC voltage, and then changing the DC voltage back to another three-phase AC voltage at a desired voltage and frequency. It is understood that there are also single-phase VFDs that receive single-phase AC voltage as input and output another single-phase AC voltage at a desired voltage and frequency. The following can also be applied to single-phase VFDs FIG. 1 illustrates a functional block diagram of a conventional VFD. The VFD includes a diode converter 2 (commonly a bridge rectifier), a DC bus 4, and inverter 6, and control logic 8. The diode converter 2 converts an input three-phase AC voltage to a rectified three-phase DC voltage. A first phase of the three-phase AC voltage is represented as L1, a second phase as L2, and a third phase as L3. The DC bus 4 filters the rectified three-phase DC voltage by using large smoothing capacitors, and outputs a filtered three-phase DC voltage that is input to the inverter 6. The inverter 6 converts the DC voltage back into another three-phase AC voltage at a specific frequency as required by a three-phase motor 10. The control logic 8 controls operation of the inverter 6 to set the specific frequency of the three-phase AC voltage output to the three-phase motor 10. The specific frequency of the three-phase AC voltage received by the three-phase motor 10 determines a speed (rotations per minute) of the three-phase motor 10. If the three-phase motor 10 is to operate at a different speed, then the inverter 6 is controlled by the control logic 8 to output a three-phase AC voltage at a different frequency sufficient for operating the three-phase motor 10 at the different speed. In this manner, a VFD maintains a voltage/Hertz ratio, for example 480V/60 Hz=8. If the motor is to rotate at half speed both the voltage and frequency must be halved, for example 240V/30 Hz=8. Failure to maintain the ratio results in the motor overheating.

FIG. 2 illustrates an exemplary schematic diagram of an implementation of a low voltage version of the VFD of FIG. 1. The converter 2 includes a bridge rectifier circuit, such as a diode bridge shown in FIG. 2. The DC bus 4 includes a link inductor (L) and smoothing capacitor (C) filter, represented by simplified LC filter shown in FIG. 2 (the link inductor L is optional). The inverter 6 includes switching devices, such as IGBTs (insulated gate bipolar transistors) shown in FIG. 2, that are each controlled by driving signals provided by the control logic 8. The control logic 8 generates control signal pulses used to control the output of the switching devices in the inverter 6 in the proper sequence for generating the three-phase AC voltage supplied to the three-phase motor 10.

Unexpected failure of a VFD causes downtime of the connected motor and loss of revenue while a replacement VFD is found and installed. Finding an identical VFD may not be possible, leading to longer downtime while related electrical and control systems are modified for the non-identical VFD replacement. VFDs may fail due to DC bus failure (capacitor failure), input rectifier failure, output IGBT failure, or overload. It is desirable to preemptively detect if a VFD is going to fail. VFD manufactures typically suggest replacing capacitors every 5-7 years regardless of their performance, which is expensive and requires significant downtime of the VFD. This is an expensive overhaul that may not be necessary.

SUMMARY OF THE INVENTION

Embodiments are directed to a DC monitoring system connected to a VFD. The DC monitoring system is configured to measure and analyze VFD operational characteristics. The VFD is configured to receive three-phase input power from a standardized source and to provide variable voltage and frequency three-phase output power to a three-phase motor. In some embodiments, the VFD and motor operate at a medium voltage (voltages between 2001 VAC and 35,000 VAC). In some embodiments, the VFD includes multiple DC buses, also referred to as a multiple DC bus configuration. The DC monitoring system includes a measurement module coupled to each DC bus of the VFD, a data communication network including a data concentrator, and a PQube monitoring device that acquires, computes and stores data for transmitting signals of the corresponding voltage values of the VFD DC bus obtained in a medium voltage compartment. The DC modules exist in medium voltage compartment and the data concentrator and PQube monitoring device are located in a low voltage compartment for processing and analysis. In some embodiments, the data communication network between the DC buses and the data concentrator is an optical network, such as a non-conductive fiber. The data communication network provides ground isolation and no direct electrical conduction path from the medium voltage compartment into the low voltage compartment. Processing of the data signals enables comparative and predictive analysis to determine early warning for possible capacitance failure in the VFD.

In an aspect, a system to determine failure in a variable frequency drive is disclosed. The system comprises the variable frequency drive comprising a DC bus, and a measurement device coupled to the DC bus. The measurement device is configured to measure a voltage waveform of the DC bus and to process the measured voltage waveform to determine a voltage ripple ratio. The voltage ripple ratio comprises a second filtered value divided by a first filtered value, the first filtered value is a DC voltage value of the measured voltage value and the second filtered value is a voltage ripple value of the measured voltage value. The measurement device is further configured to compare the voltage ripple ratio to a threshold value, and to generate a warning signal if the voltage ripple ratio is equal to or greater than the threshold value. In some embodiments, the DC voltage value is an average value of the measured voltage waveform over a defined period of time. In some embodiments, the DC voltage value is a root mean square value of the measured voltage waveform over a defined period of time. In some embodiments, the DC voltage value is a peak value of the measured voltage waveform over a defined period of time. In some embodiments, the measured voltage waveform includes a voltage ripple waveform component, and the voltage ripple value is a root mean square of the voltage ripple waveform component over a defined period of time. In some embodiments, the measured voltage waveform includes a voltage ripple waveform component, and the voltage ripple value is an average of the voltage ripple waveform component over a defined period of time. In some embodiments, the measured voltage waveform includes a voltage ripple waveform component, and the voltage ripple value is a peak value of the voltage ripple waveform component over a defined period of time. In some embodiments, the measured voltage waveform comprises an AC voltage component and a DC voltage component, and the voltage ripple value is representative of the AC voltage component and the DC voltage value is representative of the DC voltage component. In some embodiments, the variable frequency drive is a medium voltage variable frequency drive configured to receive an input medium voltage. In some embodiments, the medium voltage comprises a voltage value in the range of 2001 VAC to 35,000 VAC. In some embodiments, the variable frequency drive is a low voltage variable frequency drive configured to receive as input a low voltage. In some embodiments, the medium voltage comprises a voltage value in the range of 0 to 2000 VAC. In some embodiments, the DC bus comprises a filtering capacitor, and the warning signal indicates upcoming capacitance failure of the filtering capacitor.

In another aspect, another system to determine failure in a variable frequency drive is disclosed. The system comprises a variable frequency drive comprising a plurality of DC buses, a plurality of measurement devices, and a PQube measurement device. One measurement device is coupled to one of the plurality of DC buses, wherein each measurement device is configured to measure a voltage waveform of the corresponding DC bus. The PQube measurement device is coupled to the plurality of measurement devices to receive data signals representative of the measured voltage waveforms. The PQube measurement device is configured to process the measured voltage waveform to determine a voltage ripple ratio for each DC bus. The voltage ripple ratio comprises a second filtered value divided by a first filtered value, the first filtered value is a DC voltage value of the measured voltage waveform and the second filtered value is a voltage ripple value of the measured voltage waveform. The PQube measurement device is further configured to compare the voltage ripple ratio for each DC bus to a threshold value, and to generate a warning signal if the voltage ripple ratio is equal to or greater than the threshold value. In some embodiments, the DC voltage value is an average value of the measured voltage waveform over a defined period of time. In some embodiments, the DC voltage value is a root mean square value of the measured voltage waveform over a defined period of time. In some embodiments, the DC voltage value is a peak value of the measured voltage waveform over a defined period of time. In some embodiments, the measured voltage waveform includes a voltage ripple waveform component, and the voltage ripple value is a root mean square of the voltage ripple waveform component over a defined period of time. In some embodiments, the measured voltage waveform includes a voltage ripple waveform component, and the voltage ripple value is an average of the voltage ripple waveform component over a defined period of time. In some embodiments, the measured voltage waveform includes a voltage ripple waveform component, and the voltage ripple value is a peak value of the voltage ripple waveform component over a defined period of time. In some embodiments, the measured voltage waveform comprises an AC voltage component and a DC voltage component, and the voltage ripple value is representative of the AC voltage component and the DC voltage value is representative of the DC voltage component. In some embodiments, the variable frequency drive is a medium voltage variable frequency drive configured to receive as input a medium voltage. In some embodiments, the medium voltage comprises a voltage value in the range of 2001 VAC to 35,000 VAC. In some embodiments, each DC bus has a low voltage. In some embodiments, the low voltage comprises a voltage value in the range of 0 to 2000 VAC. In some embodiments, the DC bus comprises a filtering capacitor, and the warning signal indicates upcoming capacitance failure of the filtering capacitor. In some embodiments, the PQube measurement device is further configured to compare the voltage ripple value component of each DC bus to the voltage ripple value component of one or more other DC buses, and if the voltage ripple value components are not equal then the warning signal is generated.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a DC monitoring system. Those of ordinary skill in the art will realize that the following detailed description of the DC monitoring system is illustrative only and is not intended to be in any way limiting. Other embodiments of the DC monitoring system will readily suggest themselves to such skilled persons having the benefit of this disclosure.

Reference will now be made in detail to implementations of the DC monitoring system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Embodiments are directed to a DC monitoring system connected to a VFD. The DC monitoring system is configured to measure and analyze VFD operational characteristics. In some embodiments, the VFD is configured to receive three-phase input power from a standardized source and to provide variable frequency three-phase output power to a three-phase motor. It is understood that the concepts, structures, and functions described herein related to the DC monitoring system can be applied to a single-phase VFD. In some embodiments, the VFD and motor operate at a medium voltage. As used herein, low voltage refers to voltages less than or equal to 2000 VAC, and medium voltage has a voltage level in the range of 2001 VAC to 35,000 VAC, as defined by the NFPA. Operating at medium voltage requires significant safety precautions, particularly when considering the connection and use of the DC monitoring system in the medium voltage environment.

Figure 1:
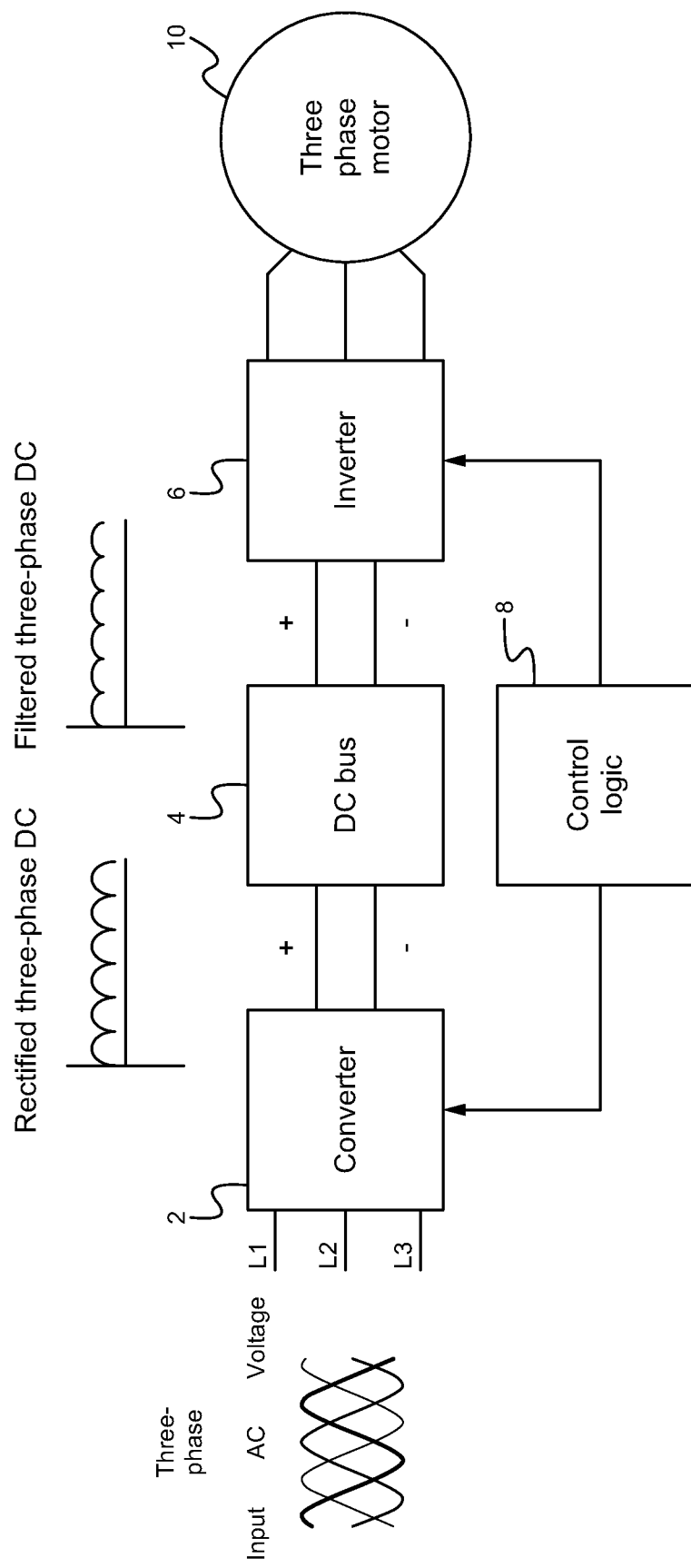
FIG. 1 illustrates a functional block diagram of a conventional VFD.
Figure 2:
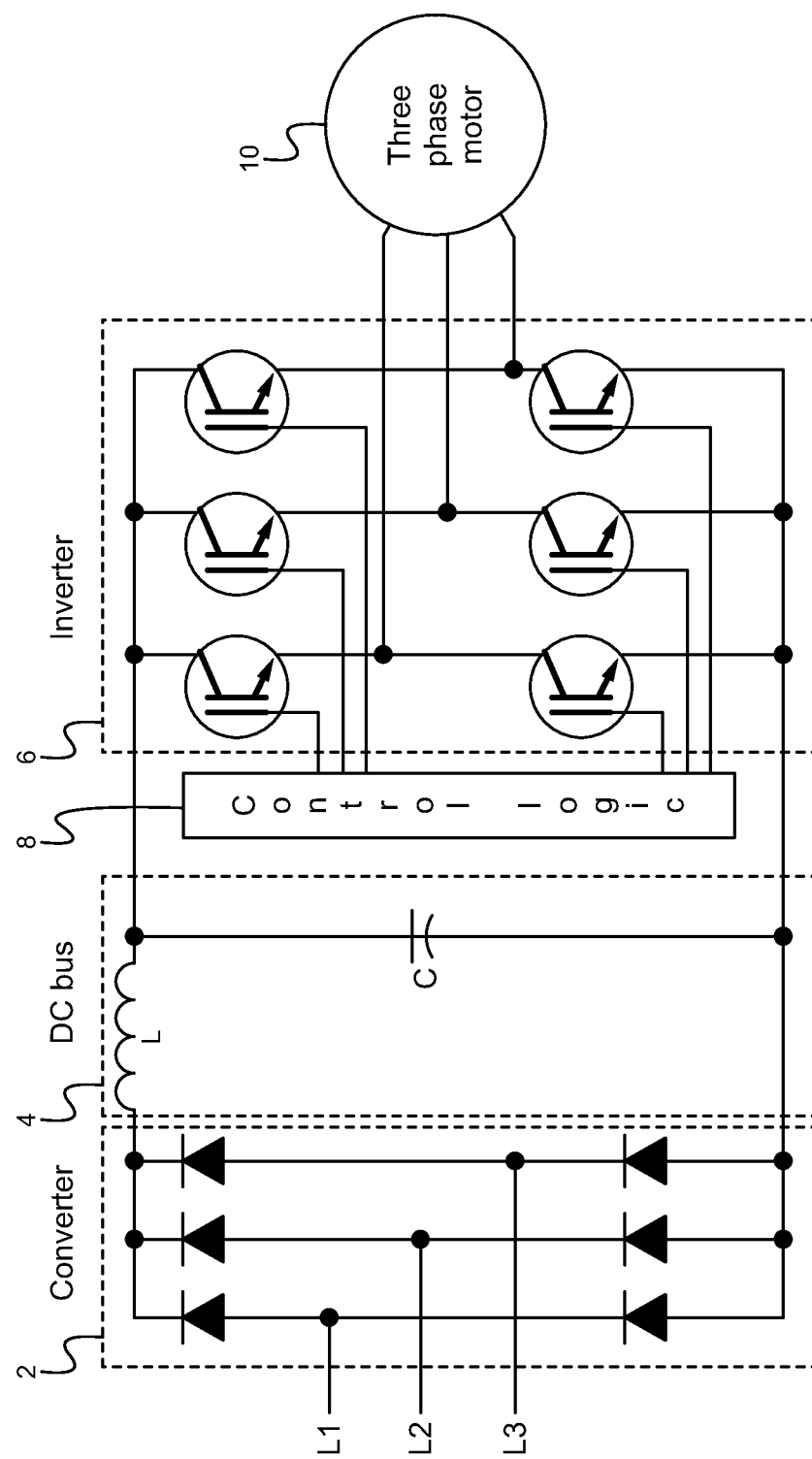
FIG. 2 illustrates an exemplary schematic diagram of an implementation of a low voltage version of the VFD of FIG. 1.
Figure 3:
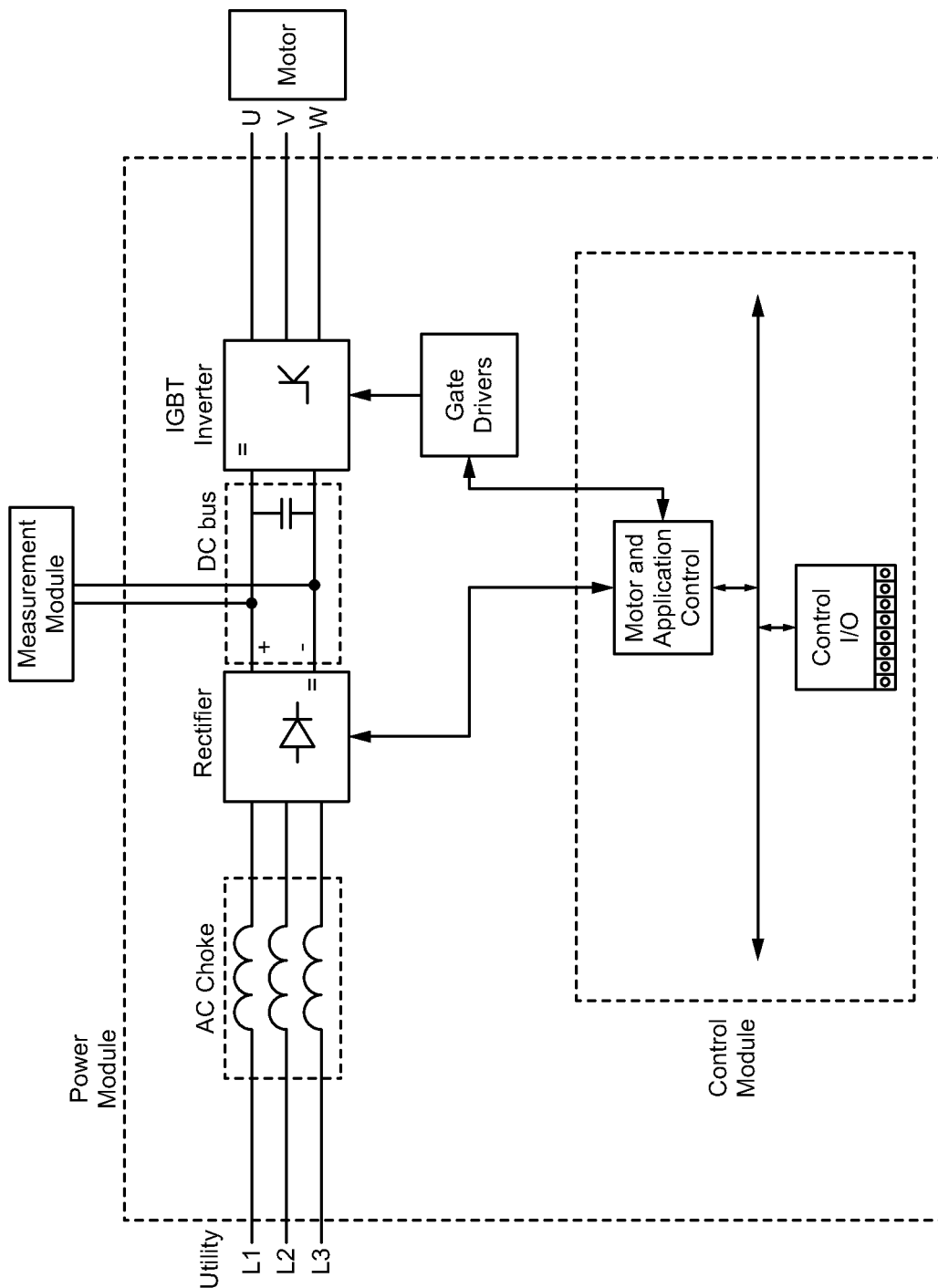
FIG. 3 illustrates a schematic block diagram of a VFD operating at low voltage according to some embodiments.

FIG. 3 illustrates a schematic block diagram of a VFD operating at low voltage according to some embodiments. The VFD shown in FIG. 3 is similar in function to the VFD shown and described in FIG. 2, and includes a converter (rectifier), a DC bus, an inverter, and a control module that includes control logic. FIG. 3 shows additional features of a common VFD including an AC choke (optional) and gate drivers. Current sensors and the voltage sensors can also be included to sense the current and voltage levels at the three outputs of the inverter. A measurement block can be included that receives and processes the sensed current and voltage signals, which are then transmitted to the control module. In some embodiments the control module controls operation of the rectifier and the inverter according to programmed logic, input control instructions, and sensed data received from the measurement module. The control module can include circuitry, such as processing circuitry and memory, necessary for all internal logic and decision making requirements for controlling the switching devices in the inverter circuit so as to output the three-phase AC voltage having the specific voltage and frequency for operating the three-phase motor at an intended speed or torque. Gate drivers used to provide drive signals to the transistors in the inverter are controlled by the control module. Although the gate drivers are show as separate circuitry from the control module, the gate drivers can be included as part of the control module. External connections to the DC bus can be provided via a link inductor (DC Choke) and brake chopper at terminals connection points on the low voltage VFD. In medium voltage VFD's the connections are not available externally but directly inside the medium voltage compartment (bus bars). The DC monitoring system includes a measurement module, which is connected to the DC bus via the terminal connection points. The measurement module includes circuitry for measuring the voltage across the DC bus. This connection to the DC bus also provides power to the measurement module, and as such, in some embodiments, the measurement module may not include an internal power supply. In this exemplary low voltage application, a low voltage three-phase AC voltage is supplied at L1, L2, L3. The rectifier converts the low voltage three-phase AC voltage to a low voltage DC voltage, which is measured across the DC bus by the measurement module. The inverter converts the low voltage DC voltage to the specific low voltage AC voltage and frequency to be supplied to the motor, which is output from the VFD at U, V, W as low voltage three-phase AC voltage.

Figure 4:
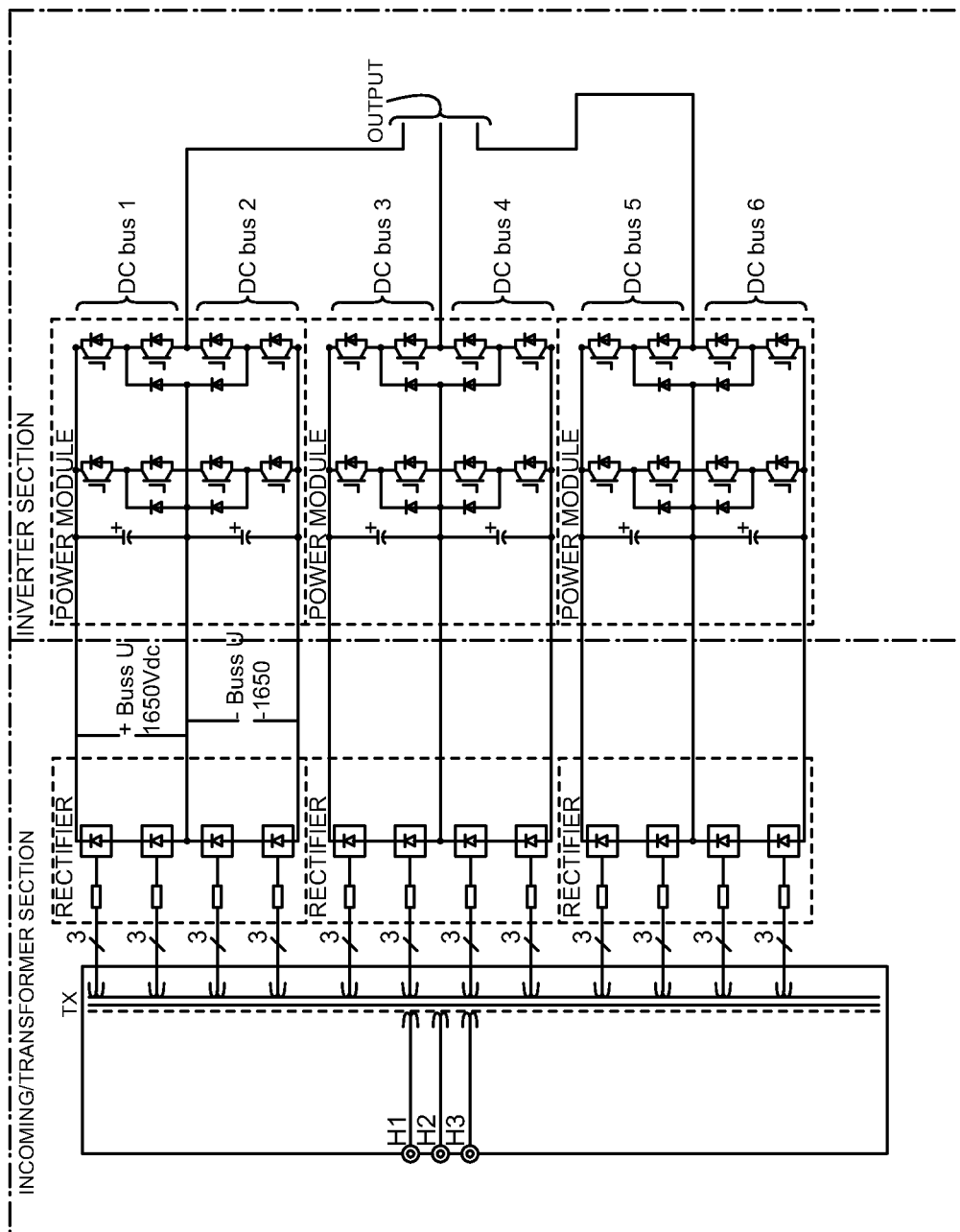
FIG. 4 illustrates a schematic block diagram of a medium voltage VFD having multiple DC buses according to some embodiments.

In medium voltage applications, the high voltage levels dictate the parsing of the DC bus into multiple DC buses. FIG. 4 illustrates a schematic block diagram of a medium voltage VFD having multiple DC buses according to some embodiments. In the exemplary configuration shown in FIG. 4 there are six DC buses, for example DC bus 1, DC bus 2, etc. This configuration has three power arms, referred to as modules. Each module includes 2 DC buses, one negative voltage DC bus up to −2000 VDC, one positive voltage DC bus up to 2000 VDC, and a common zero voltage bus. It is understood that the VFD can be configured to have more or less than 6 DC buses, for example up to 15 DC buses or more.

A medium voltage three-phase AC voltage is input to the VFD at H1, H2, H3. The input medium voltage three-phase AC voltage is received at the primary windings of the transformer TX. The transformer TX has three primary windings, one for each of the three-phases, and multiple secondary windings. The transformer TX is configured to step down and isolate the primary side medium voltage to a secondary side low voltage. Each secondary winding is coupled to a corresponding rectifier that converts the low voltage three-phase AC voltage output from the secondary winding to a rectified low voltage three-phase DC voltage. The rectifiers are configured as series connected pairs, each pair connected to a corresponding DC bus. Two pairs are connected in series to form a module. Each DC bus includes a capacitor. A measurement module (not shown), such as the measurement module in FIG. 3, is connected to each DC bus. The capacitor in each DC bus is connected in parallel to a corresponding inverter. The rectified low voltage three-phase DC voltage output from the rectifier is applied to the DC bus of the inverter. The rectified low voltage three-phase DC voltage is converted by the inverter to a low voltage three-phase AC voltage. The low voltage three-phase AC voltages output from each inverter are combined, or stacked, to provide a medium voltage three-phase AC voltage that is output to the motor. In this manner, the medium voltage VFD receives a medium voltage input and provides a medium voltage output, although each DC bus in the multiple bus configuration carries a low voltage. In some embodiments, this makes it possible to use less-expensive mass-produced low-voltage IGBT's in the VFD. In an exemplary configuration, each measurement module is configured to measure low voltages across each DC bus in the range of approximately 500 VDC to 2000 VDC, with an accuracy of 250 mV and a measurement resolution of 28 mV. Expected operating temperature is to be in the range of −20 degree C. to +60 degree C. By way of an example, Table 1 shows exemplary voltage readings determined from voltage measurements taken across each of the six DC buses of FIG. 4. The voltage measurements are processed to determine an average voltage during a defined time period, a voltage ripple peak during the time period, and a voltage ripple ratio. In this example, the voltage ripple ratio is the ratio of the voltage ripple peak divided by the average voltage. Each of these values, and the method for determining each value, is described in greater detail below.

TABLE 1

|  | Average | Voltage Ripple Peak | Ripple Ratio |
| --- | --- | --- | --- |
| DC bus 1 | 1685.96 V | 11.45 V | 0.68% |
| DC bus 2 | 1692.60 V | 9.11 V | 0.54% |
| DC bus 3 | 1694.52 V | 11.09 V | 0.65% |
| DC bus 4 | 1687.88 V | 10.91 V | 0.64% |
| DC bus 5 | 1692.12 V | 11.81 V | 0.70% |
| DC bus 6 | 1687.08 V | 10.82 V | 0.64% |

Figure 5:
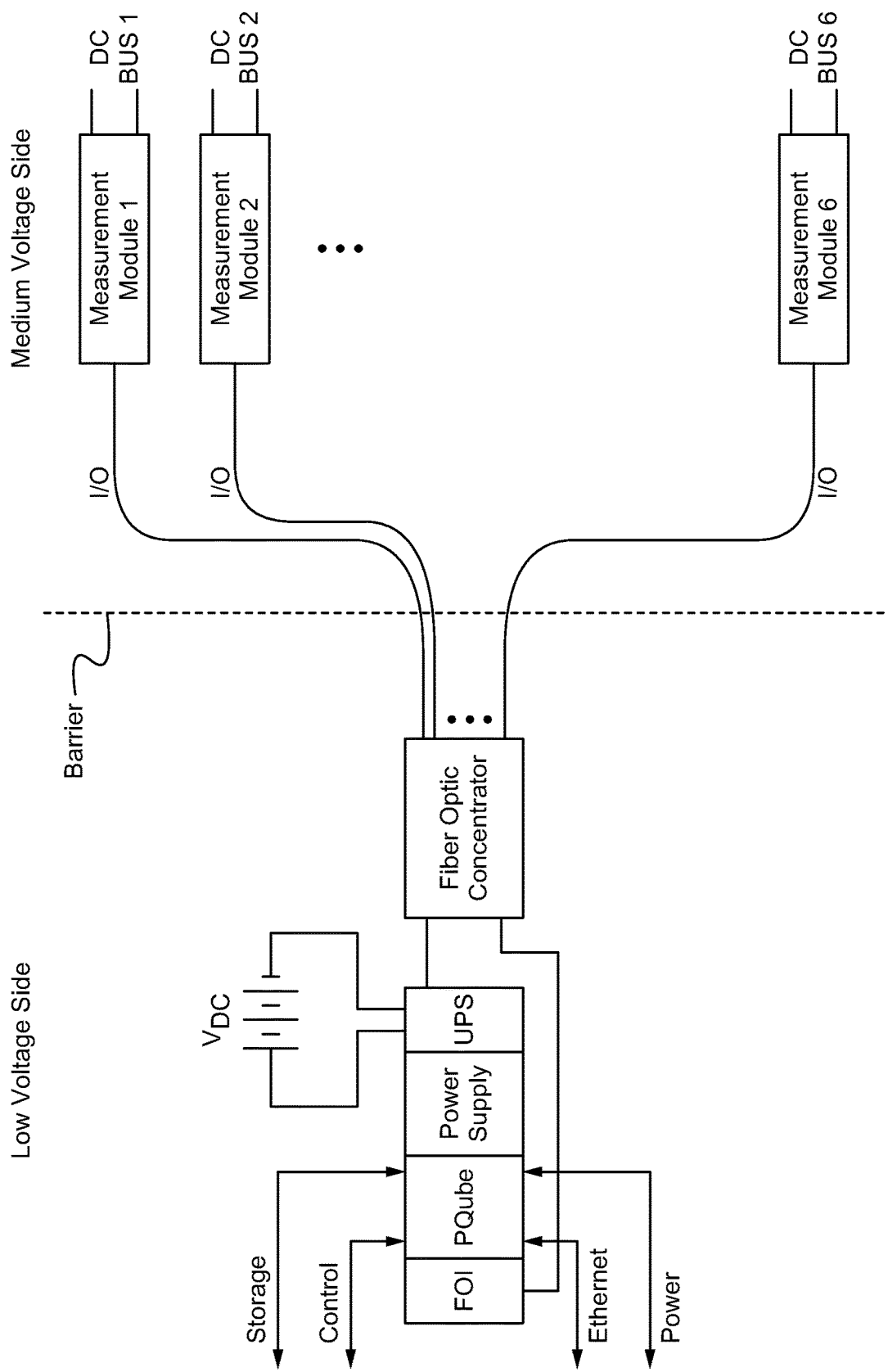
FIG. 5 illustrates a functional block diagram of the DC monitoring system configured for transmitting data from a medium voltage compartment to a low voltage compartment according to some embodiments.

In the case of a medium voltage application of the VFD, it is dangerous for a user to work directly with the medium voltage VFD due to the higher voltages and power present. Making routing test measurements on each DC bus section is part of a preventative maintenance plan, but this is often skipped due to the hazards present. It is desirable for a user to interface with the VFD and the DC monitoring system connected to the VFD at an interface that is within the low voltage compartment. To accommodate such a physical separation, the DC monitoring system includes a monitoring device, referred to as a PQube monitoring device, that is located in the low voltage compartment with a VFD low voltage control system, and a data transmission network for interconnecting the PQube monitoring device to the measurement modules connected to the VFD in the medium voltage compartment. The PQube monitoring device is located in the low voltage compartment with the VFD controls. The PQube monitoring device is powered from a low voltage power source, such as 24 VDC/120 VAC from a main line that is readily available in the low voltage compartment. FIG. 5 illustrates a functional block diagram of the DC monitoring system configured for transmitting data from a medium voltage compartment to a low voltage compartment according to some embodiments. The DC monitoring system shown in FIG. 5 is configured for a medium voltage VFD similar to that shown in FIG. 4. The VFD shown includes six DC busses, labeled as DC bus 1, DC bus 2, etc. A separate measurement module, such as the measurement module shown in FIG. 3, is connected to each DC bus via dedicated terminal connection points for each DC bus. This connection to the DC bus also provides power to the measurement module, and as such, in some embodiments, the measurement module may not include an internal power supply. Each measurement module is also not referenced to ground but is instead floating relative to the DC bus potential. Failure to not float the measurement module reference may result in the VFD entering a fault mode and not operating correctly. The measurement modules are labeled as measurement module 1, measurement module 2, etc. As such, there is a measurement module for each DC bus. One or more fiber optic cables are connected to each measurement module 1-6. Each measurement module is configured to sense the voltage levels at the correspondingly connected DC bus, generate data signals representative of the sensed voltage levels, and transmit the data signals over the attached fiber optic cables. Each measurement module includes an appropriate network interface for interconnecting to the connected fiber optic cable. In the low voltage compartment, each of the fiber optic cables is connected to a fiber optic concentrator or other appropriate network switch. The PQube monitoring device is connected to the fiber optic concentrator via a fiber optic interface (FOI). In some embodiments, the PQube monitoring device is connected to the fiber optic interface by a fiber optic cable. The data signals transmitted over the fiber optic cables are received by the fiber optic concentrator and provided to the PQube monitoring device. The fiber optic communication network provides ground isolation and no direct electrical conduction path from the medium voltage compartment into the low voltage compartment. The dashed line shown in FIG. 5 represents an actual physical barrier, such as a wall, that separates the medium voltage compartment and the low voltage compartment. A hole can be made in the physical barrier to enable the fiber optic cables connecting the measurement modules and the fiber optic concentrator to pass through. No electrically conductive pathways are to exist connecting the medium voltage compartment to the low voltage compartment. Also, in the low voltage compartment, there is a power supply and a backup power supply, such as an uninterruptable power supply (UPS), connected to the PQube monitoring device.

The PQube monitoring device includes computer processing and memory storage circuitry for converting the received data signals to corresponding sensed voltage values and for processing and analyzing these voltage values to determine corresponding rectified three-phase voltage waveforms on each of the DC buses in the VFD, and for determining filtered values (such as averages) of the rectified three-phase voltage waveforms, voltage ripple waveforms, and calculating and storing the voltage ripple ratio result. The PQube monitoring device can also be connected to an external network, such as by an ethernet TCP/IP network or ModBus TCP or other type of network connection, wired or wireless. The PQube monitoring device can be further configured for external control, storage, and power connections.

VFDs suffer from a common failure mode, namely DC bus capacitor failure in the case of voltage sourced VFDs. In medium voltage applications, large capacitors in the DC bus are required. DC bus capacitor failure in such medium voltage configurations can lead to extremely dangerous conditions. Detecting the on-set of this failure is desirable to prevent the extensive damage that can be caused by a high voltage, high energy explosion that can result from this type of failure. The DC monitoring system enables measurement and analysis of VFD operational characteristics to determine possible failure conditions and initiate early failure warning. Such measurement, analysis, and determination can be applied to all VFD sizes and voltages without complex calculations and setup requirements.

It some embodiments, the DC monitoring system is part of a larger three-phase electrical system that includes a VFD connected to a three-phase motor. The VFD converts a three-phase AC voltage received from the electrical grid to another three-phase AC voltage suitable for operating a connected three-phase motor. An operational speed of the three-phase motor is dictated by the voltage and frequency of the three-phase AC voltage output by the VFD. The speed of the motor can be adjusted by the VFD adjusting the voltage and frequency of the three-phase AC voltage supplied to the motor. The input three-phase AC voltage has a standardized frequency, such as 50 or 60 Hz, and the output three-phase AC voltage has a specific voltage and frequency to operate the motor at a specific speed.

Figure 6:
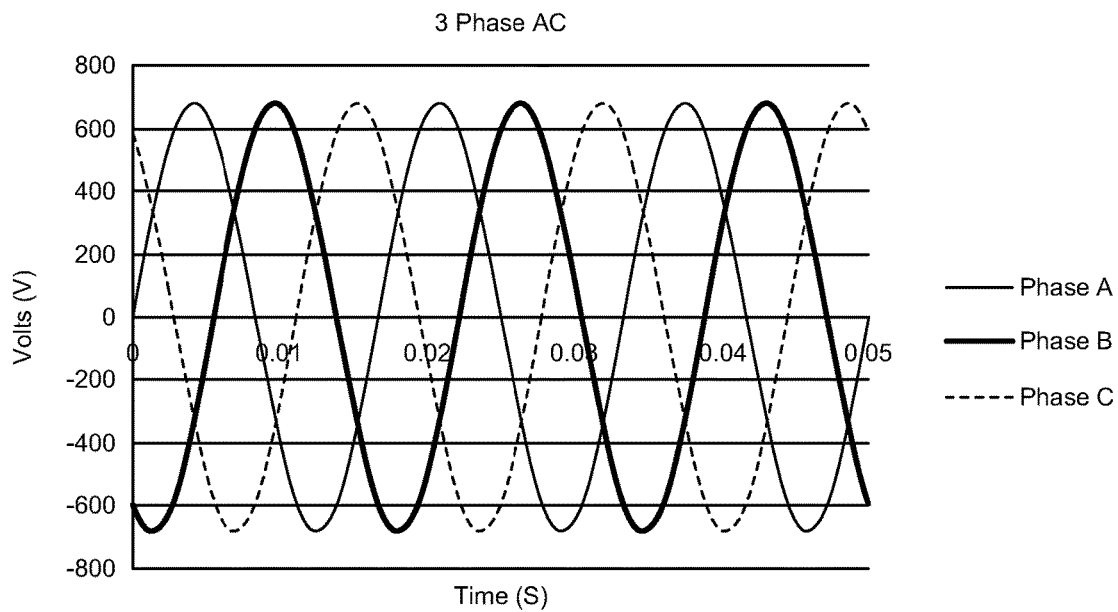
FIG. 6 illustrates exemplary low voltage three-phase AC voltage waveforms across each secondary winding in the medium voltage VFD or input waveforms to a low voltage VFD according to some embodiments.

In the medium voltage application, the medium voltage three-phase AC voltage, such as 4160 VAC, is input to the VFD. As described above in regard to FIG. 4, the input medium voltage three-phase AC voltage is received at the primary windings of the transformer in the VFD, which steps down the primary side medium voltage to a secondary side low voltage across multiple different secondary windings, each connected to a corresponding rectifier and DC bus. FIG. 6 illustrates exemplary low voltage three-phase AC voltage waveforms across each secondary winding in the medium voltage VFD or input waveforms to a low voltage VFD according to some embodiments. The three-phase AC voltage waveforms includes a phase A voltage waveform, a phase B voltage waveform that is 120 degrees out of phase with the phase A voltage waveform, and a phase C voltage waveform that is 120 degrees out of phase with the phase B voltage waveform. Each of the exemplary three-phase AC voltage waveforms shown in FIG. 6 have a voltage level of 480 VAC and frequency of 60 Hz. It is understood that alternative three-phase AC voltages can be used having different voltages and frequencies than the example of FIG. 6.

Figure 7:
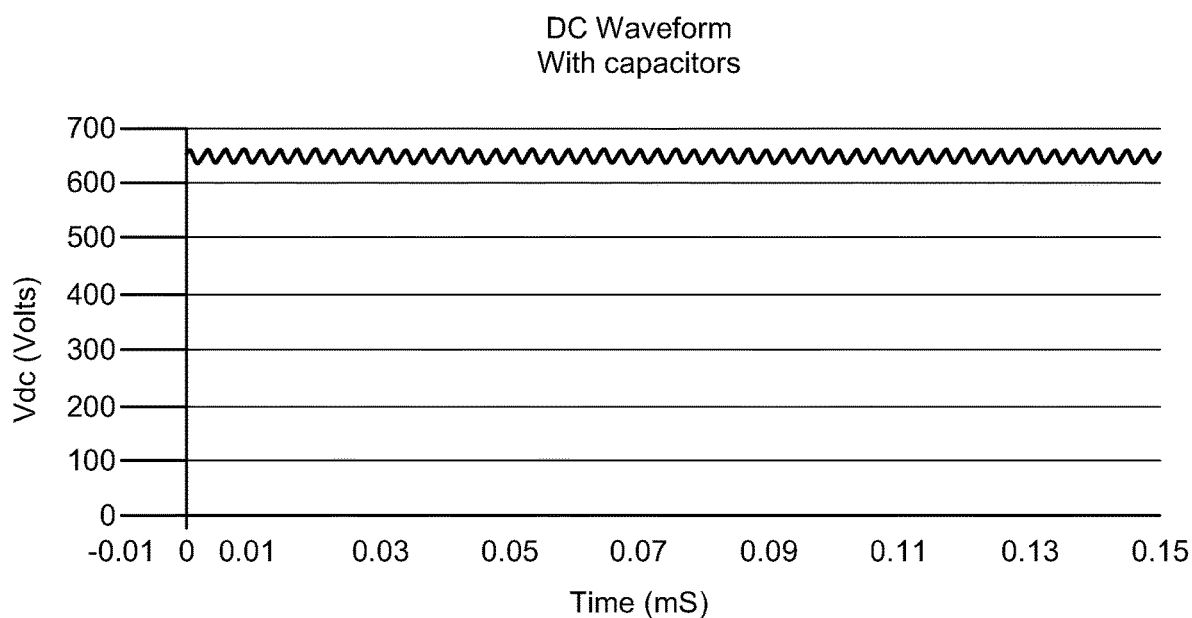
FIG. 7 illustrates a rectified low voltage three-phase DC voltage waveform corresponding to the low voltage three-phase AC voltage waveforms of FIG. 6.

The low voltage three-phase AC voltage is supplied as input to the converter of the VFD. The converter rectifies the input low voltage three-phase AC voltage and outputs a corresponding rectified low voltage three-phase DC voltage. FIG. 7 illustrates a rectified low voltage three-phase DC voltage waveform corresponding to the low voltage three-phase AC voltage waveforms of FIG. 6. The rectified low voltage three-phase DC voltage waveform includes two components: a DC component and a voltage ripple component, simply referred to as voltage ripple. Voltage ripple is commonly referred to as an AC component.

Figure 8:
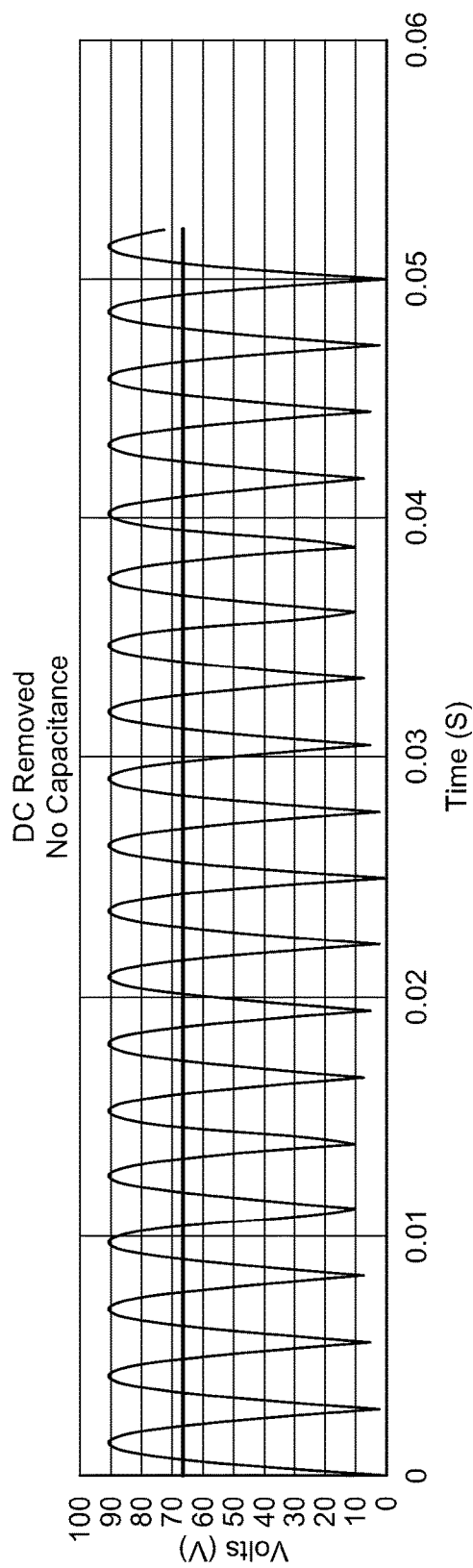
FIG. 8 illustrates a voltage ripple waveform corresponding to the rectified low voltage three-phase DC voltage waveform of FIG. 7 without a smoothing (filter) capacitor in the DC bus.

The DC component is also known as the zero harmonic DC voltage value or DC offset, which can simply be referred to as the DC voltage value. The rectified low voltage three-phase DC voltage waveform fluctuates about the fixed DC voltage value (DC component). This fluctuation is the voltage ripple, which is an artifact of the AC-to-DC conversion performed by the rectifiers. Voltage ripple generates unwanted harmonics, which can be reduced by increasing the capacitance of the capacitor in the DC bus. The capacitance value is a function of current demand (motor torque). As the capacitance decreases with age the current draw (seen as ripple) increases. This overloads the capacitor and it overheats, which can result in capacitor failure. By way of comparison, three different voltage ripple waveforms are shown in FIGS. 8-11. FIG. 8 illustrates a voltage ripple waveform corresponding to the rectified low voltage three-phase DC voltage waveform of FIG. 7 without a capacitor in the DC bus. The voltage ripple waveform is obtained by subtracting out, or removing, the fixed DC voltage value (DC component).

Figure 9:
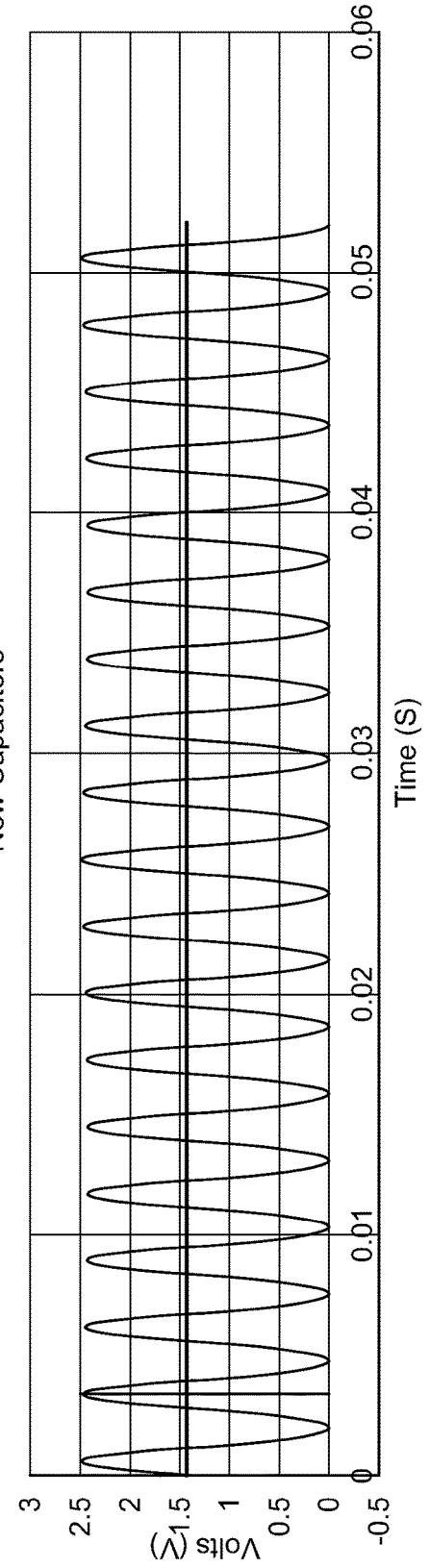
FIG. 9 illustrates an exemplary voltage ripple waveform where the DC bus has a new capacitor.
Figure 10:
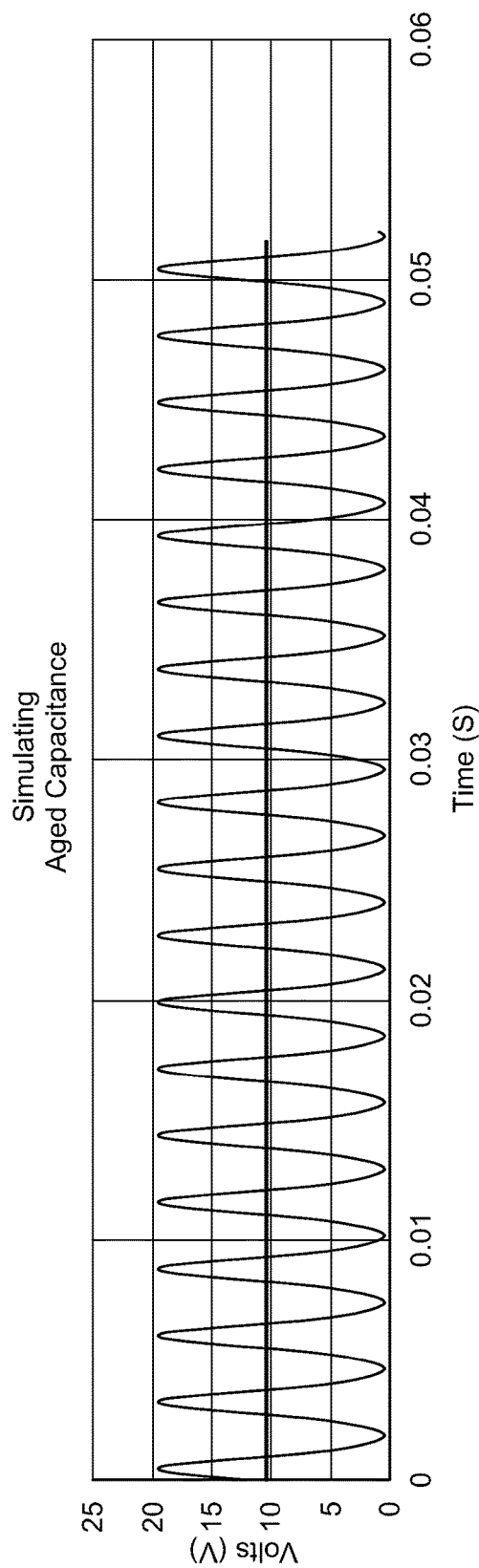
FIG. 10 illustrates an exemplary voltage waveform where the DC bus capacitor is aged.
Figure 11:
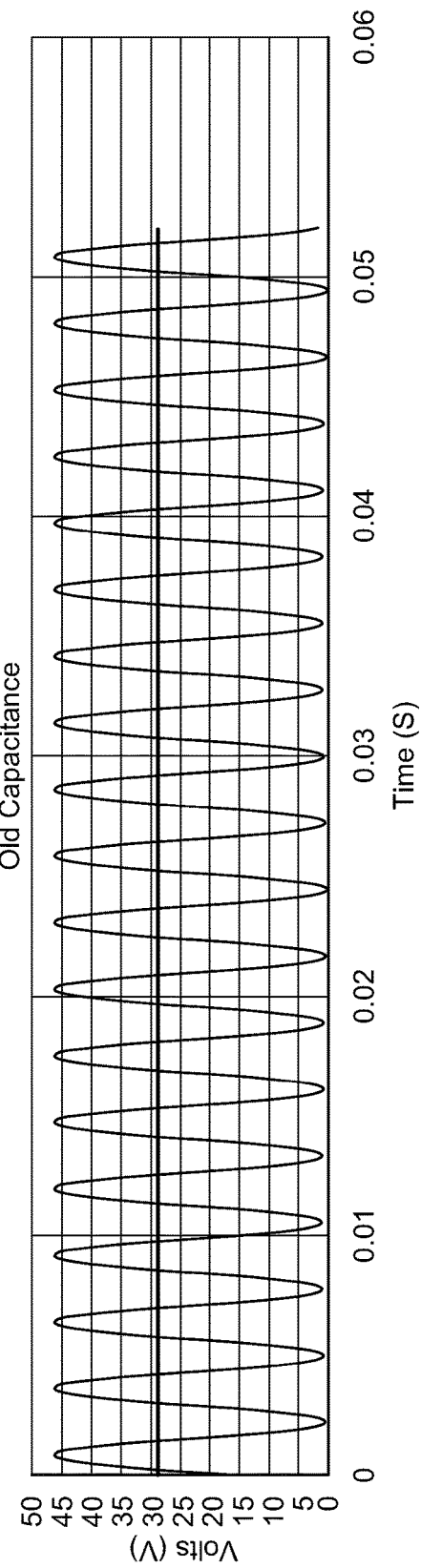
FIG. 11 illustrates an exemplary voltage ripple waveform where the DC bus capacitor is old, or near end of life.
Figure 12:
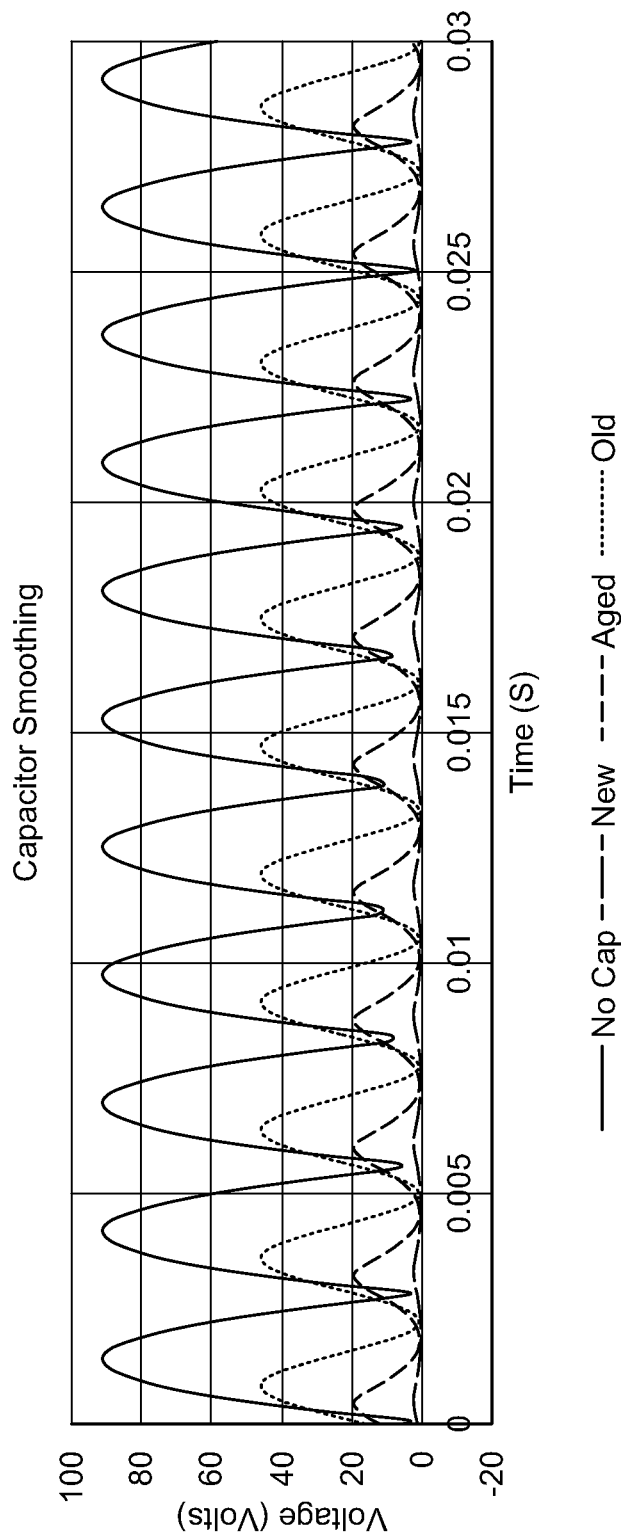
FIG. 12 illustrates an overlay of the exemplary voltage ripple waveforms shown in FIGS. 8-11.

The voltage ripple waveform shown in FIG. 8 illustrates the peak to peak voltage ripple, which represents a worst-case scenario and also represents the case of the DC bus having zero capacitance. FIG. 9 illustrates an exemplary voltage ripple waveform where the DC bus has a new capacitor. However, as capacitors age, their capacitance decreases, resulting in an increase in voltage ripple. FIG. 10 illustrates an exemplary voltage waveform where the DC bus capacitor is aged. "Aged" is considered an intermediate time between new and end of life. The voltage ripple waveform of FIG. 10 corresponds to the same DC bus capacitor applied as in the voltage ripple waveform of FIG. 9, except the capacitor is aged compared to being new. FIG. 11 illustrates an exemplary voltage ripple waveform where the DC bus capacitor is old, or near end of life. The voltage ripple waveform of FIG. 11 corresponds to the same DC bus capacitor applied as in the voltage ripple waveform of FIG. 9, except the capacitor is old compared to being new. VFD manufactures typically suggest replacing capacitors every 5-7 years regardless of their performance, which is expensive and requires significant downtime of the VFD. FIG. 12 illustrates an overlay of the exemplary voltage ripple waveforms shown in FIGS. 8-11. As can be seen from the comparison of the voltage ripple waveforms, the voltage ripple can be significantly reduced by capacitor filtering, as shown by comparing the unfiltered voltage ripple waveform to the voltage ripple waveform filtered with new capacitors, but the filter effectiveness diminishes over time, as shown by comparing the voltage ripple waveform filtered with new capacitors to the voltage ripple waveform filtered with old capacitors. Table 2 shows the corresponding RMS values of the voltage ripple waveforms shown in FIG. 12.

TABLE 2

| Unfiltered (DC removed) | Filtered with New Capacitors | Filtered with Aged Capacitors | Filtered with Old Capacitors |
| --- | --- | --- | --- |
| 66.40 V (RMS) | 1.43 V (RMS) | 10.49 V (RMS) | 28.89 V (RMS) |

Eventually, the diminished capacitance of aging capacitors reaches a critical point, leading to DC bus failure. Capacitors lose capacitance due to two main reasons: heat, and high current draw that leads to heat. Eventually, the electrolyte in the capacitor evaporates or boils leading to an internal short and in some cases an explosion. Conventionally, the voltage level of the DC bus, such as the RMS voltage level, is monitored. If the monitored voltage level drops below a certain value, then an alarm is sounded indicating a possible DC bus failure. However, this method is supply and load dependent. In other words, if the input voltage sags, then the voltage level of the DC bus also sags, and a false alarm may result. The case is similar for load, if the load increases the DC bus may reduce and input AC voltage will drop according to the feeder line impedance. Monitoring of the DC bus voltage level, and more particularly, monitoring of the RMS voltage value of the filtered voltage ripple waveform, also fails to adequately identify decreased capacitance levels may result in a DC bus failure threshold. This is due to the fact that the RMS voltage value of the filtered rectified three-phase DC voltage remains substantially the same even as filter capacitance decreases and voltage ripple increases. The conventional methodology is heavily load dependent and provides a measure of load conditions, and is not an effective measure of early capacitor failure.

Instead of simply measuring DC voltage values and determining the RMS voltage value of the filtered rectified three-phase DC voltage waveform, the DC monitoring system also determines the voltage ripple and uses a ratio of the voltage ripple as a basis for generating an early capacitor failure warning. Although the voltage ripple value does provide an indication of potential capacitor failure in the DC bus, the voltage ripple value is an absolute value, the ranges and failure indicating thresholds of which will vary from application to application as operating voltage requirements and load conditions change. A means for normalizing the use of voltage ripple measurements across various input voltages and applications is to use a voltage ripple ratio as an indicator for potential capacitor failure in the DC bus. The voltage ripple ratio provides a dimensionless value. In general, the voltage ripple ratio is defined as:

$$\text{voltage ripple ratio} = (\text{voltage ripple value})/(\text{DC voltage value})*100\% \quad (1)$$

where the voltage ripple value is a determined value of the voltage ripple waveform over a defined period of time, and the DC voltage value is a determined value of the rectified three-phase DC voltage waveform over the defined period of time. The DC monitoring system includes program logic and algorithms for performing the described analysis, calculations, and determinations. The rectified three-phase DC voltage waveform is digitally processed by the DC monitoring system, such as by the measurement module or the PQube monitoring device, to determine the voltage ripple value and the DC voltage value. The rectified three-phase DC voltage waveform can be digitally processed by filtering or other digital processing techniques.

Figure 13:
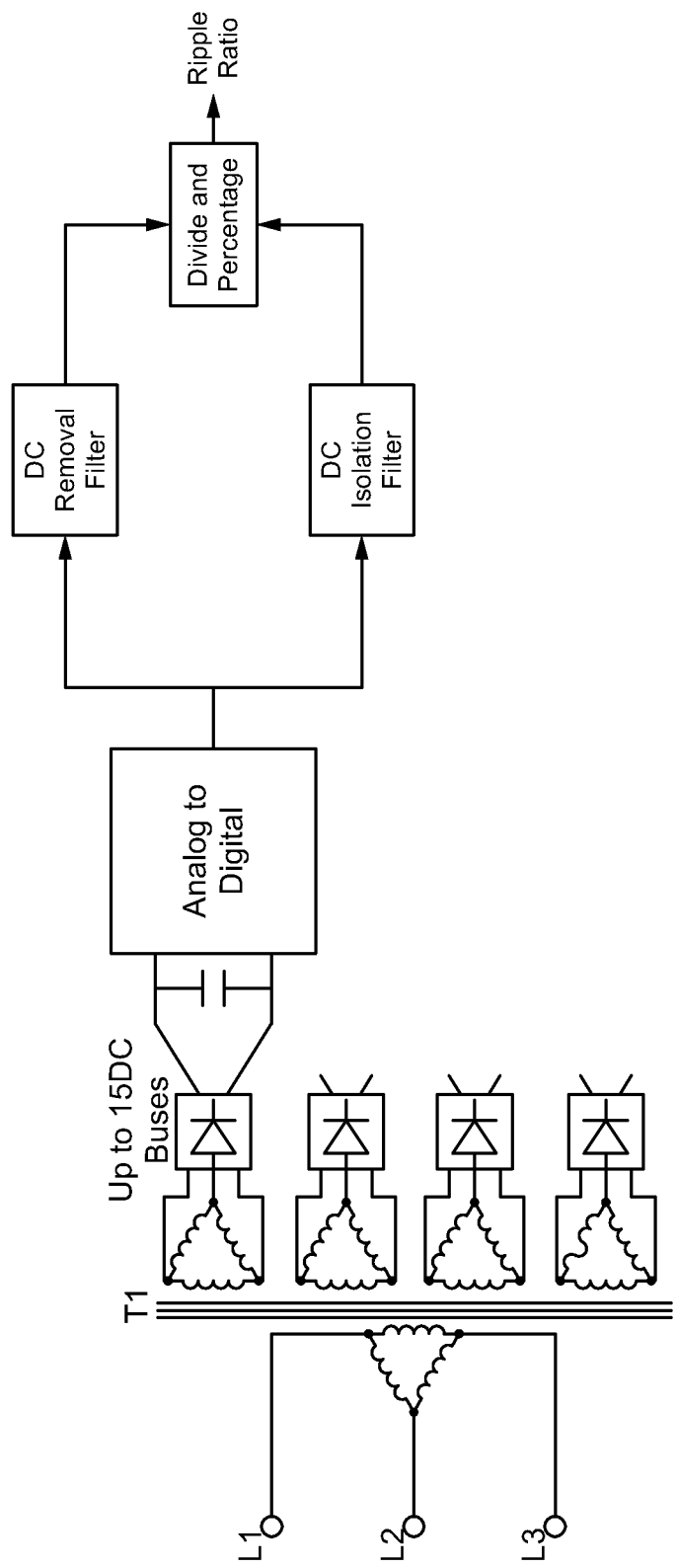
FIG. 13 illustrates an exemplary data processing flow implemented by the DC monitoring system.

FIG. 13 illustrates an exemplary data processing flow implemented by the DC monitoring system. Sensed DC bus data measured by the DC monitoring system is digitized, sampled, and filtered to determine the voltage ripple value and the DC voltage value, which are then used to calculate the voltage ripple ratio. The measured voltage levels from the DC bus are sensed as analog signals that are converted to digital values by an analog-to-digital converter (ADC). An exemplary waveform sensed at the DC bus is the rectified low voltage three-phase DC voltage waveform shown in FIG. 7. In some embodiments, the ADC is included in the measurement module. After the sensed DC bus voltage is sensed and converted, the digitized signal is transmitted via the fiber optic cable to the fiber optic concentrator in the low voltage compartment. In some embodiments, two separate filtering processes are performed on the digitized signal. A first digital filtering process isolates the DC voltage value, referred to as a DC isolation filter. The result of the first digital filtering process is a determined DC voltage value, which is applied in equation (1). A second digital filtering process removes the determined DC voltage value from the digitized signal, thereby isolating the voltage ripple waveform. An exemplary output of the second digital filtering process is the voltage ripple waveform shown in either of FIGS. 8-11. A voltage ripple value is determined from the isolated voltage ripple waveform. The determined voltage ripple value is applied in equation (1). Dividing the determined voltage ripple value by the determined DC voltage value results in the voltage ripple ratio. A scaling factor can be used, such as multiplying by 100%, to obtain a more manageable value for the voltage ripple ratio.

Figure 14:
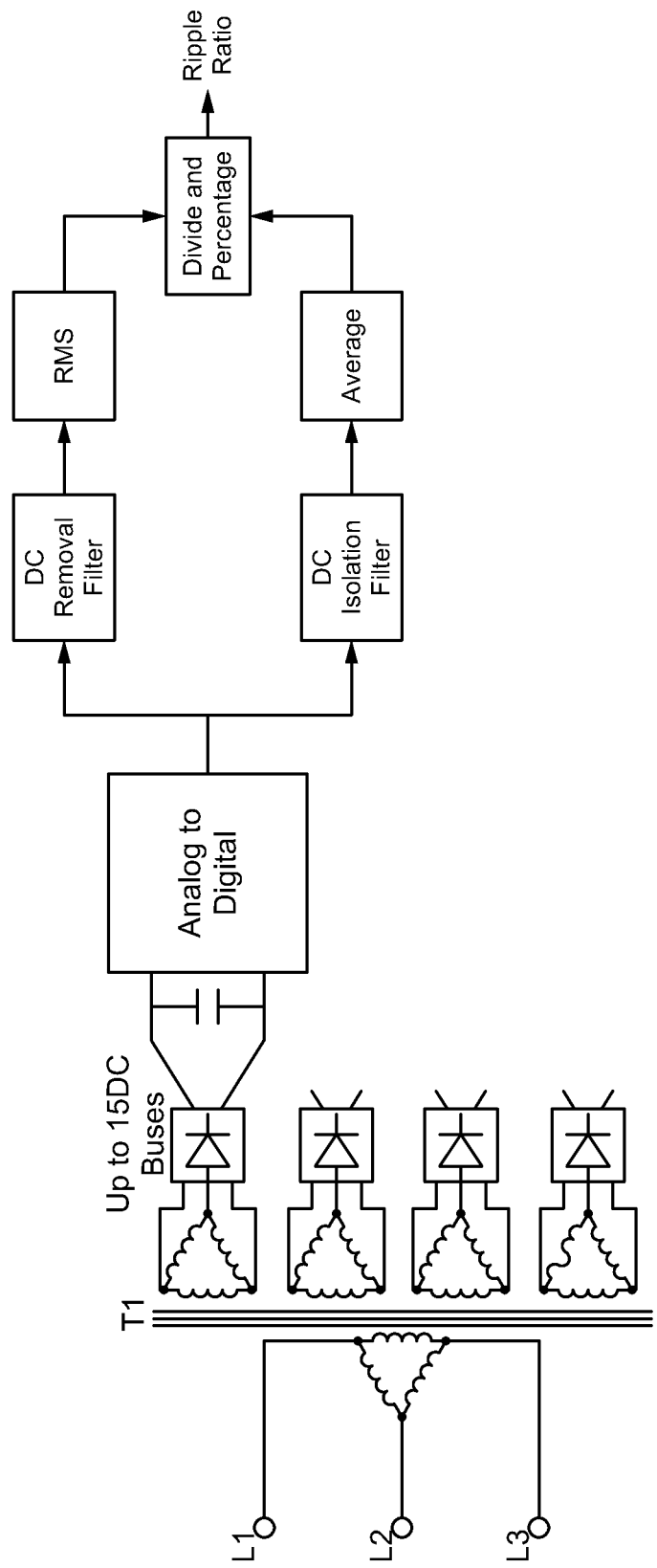
FIG. 14 illustrates the exemplary data processing flow of FIG. 13 where the first digital filtering process includes determining the average value of the rectified low voltage three-phase DC voltage waveform over a defined period of time and the second digital filtering process includes determining the RMS value of the voltage ripple waveform.
Figure 15:
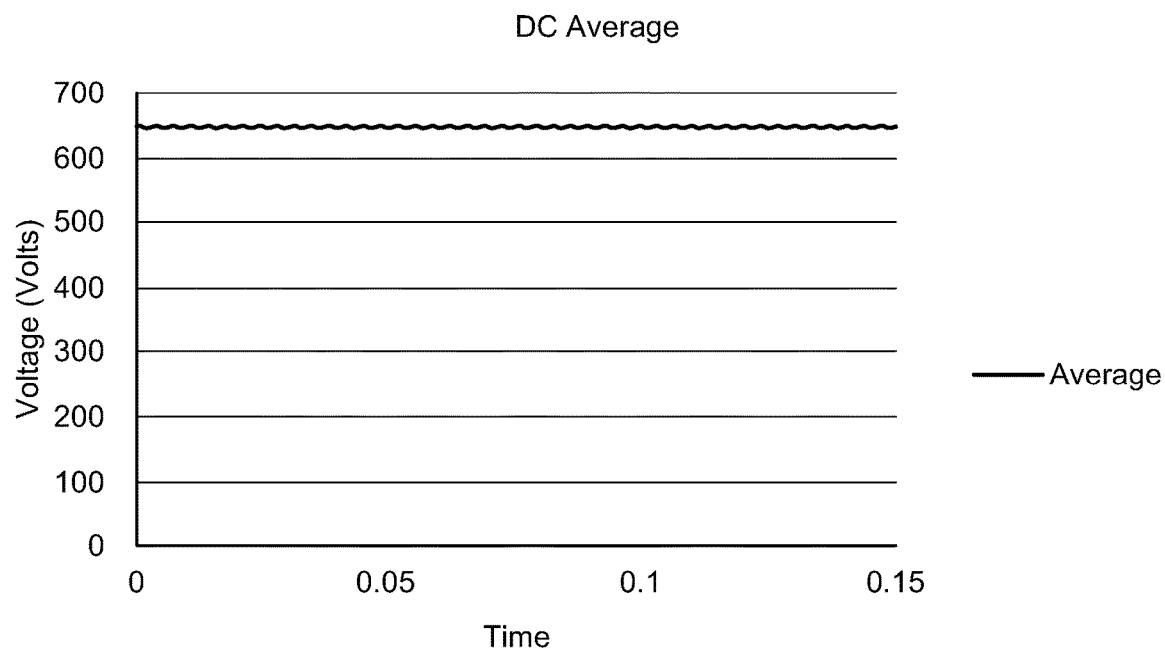
FIG. 15 illustrates an example output of the first digital filtering process of FIG. 14.
Figure 16:
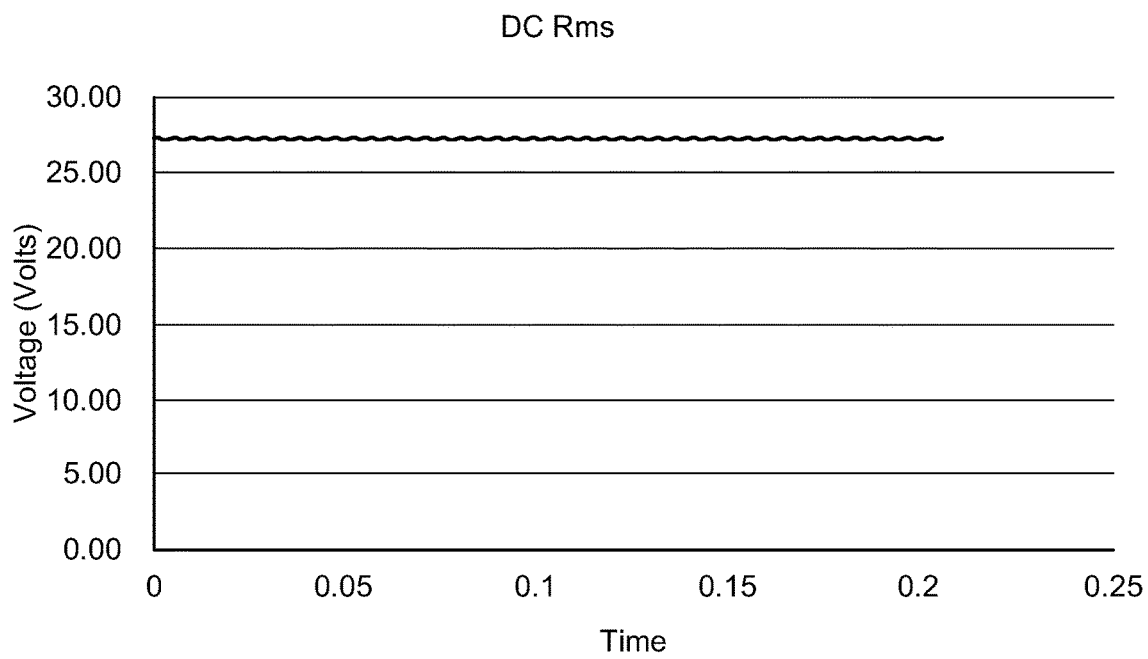
FIG. 16 illustrates an example output of the second digital filtering process of FIG. 14.

The data processing flow shown and described regarding FIG. 13 details generalized digital filtering processes. The first digital filtering process can implement a variety of different digital filtering processes for determining the DC voltage value from the digitized signal. In some embodiments, the first digital filtering process isolates the DC voltage value by taking an average value of the rectified low voltage three-phase DC voltage waveform over a defined period of time, such as a one-half cycle of the rectified low voltage three-phase DC voltage waveform. For example, the defined period of time can be 8.333 msec in a 60 Hz application, or 10.0 msec in a 50 Hz application. It is understood that processes other than taking the average value of the rectified low voltage three-phase DC voltage waveform can be implemented including, but not limited to, an RMS value of the rectified low voltage three-phase DC voltage waveform, or an average of the peak values of the rectified low voltage three-phase DC voltage waveform. Similarly, the second digital filtering process can implement a variety of different digital filtering processes for determining the voltage ripple value of the digitized signal. In some embodiments, the second digital filtering process determines the voltage ripple value by taking an RMS value of the voltage ripple waveform over the defined period of time. It is understood that processes other than taking the RMS value of the voltage ripple waveform can be implemented including, but not limited to, an average value of the voltage ripple waveform, or an average of the peak values of the voltage ripple waveform. FIG. 14 illustrates the exemplary data processing flow of FIG. 13 where the first digital filtering process includes determining the average value of the of the rectified low voltage three-phase DC voltage waveform over a defined period of time and the second digital filtering process includes determining the RMS value of the voltage ripple waveform. An example output of the first digital filtering process of FIG. 14 is the average DC voltage waveform shown in FIG. 15. The average DC voltage waveform has a constant value, referred to as an average DC voltage value. An example output of the second digital filtering process of FIG. 14 is the RMS voltage ripple waveform shown in FIG. 16, which is determined from the voltage ripple waveform of FIG. 8. The RMS voltage ripple waveform has a constant value, referred to as a RMS voltage ripple value. Equation (1) can be modified to account for the specific digital filtering processes used in FIG. 14. The modified equation (1) becomes:

$$\text{voltage ripple ratio} = (\text{RMS voltage ripple value})/(\text{average DC voltage value})*100\% \quad (2).$$

The Applicant has found that monitoring of the voltage ripple ratio provides a forward indicator of capacitor failure.

In both low voltage and medium voltage VFDs a comparison of the voltage ripple ratios for all the DC busses can be made at a glance, easily identifying the poor performing capacitor, explained in greater detail below.

Table 3 shows resultant calculations for the average DC voltage, the RMS voltage ripple, and the voltage ripple ratio for the waveforms shown in FIGS. 7-11. The column No Cap corresponds to the worst-case condition where the DC bus filter has no capacitance, as shown in the waveform in FIG. 8. The column New Cap corresponds to the condition where the capacitors in the DC bus filter are new, as shown in the waveform in FIG. 9. The column Aged Cap corresponds to the condition where the capacitors in the DC bus filter are at an intermediate stage of use, as shown in the waveform of FIG. 10. The column Old Cap corresponds to the condition where the capacitors in the DC bus filter are old (near end of life), as shown in the waveform in FIG. 11. The values for the voltage ripple ratio are calculated using equation (2).

TABLE 3

|  | No Cap | New Cap | Aged Cap | Old Cap |
| --- | --- | --- | --- | --- |
| average DC voltage (V) | 648.81 | 648.81 | 648.81 | 648.81 |
| RMS voltage ripple(V) | 66.40 | 1.43 | 10.49 | 28.89 |
| voltage ripple ratio | 10.23% | 0.22% | 1.62% | 4.45% |

The DC monitoring system can be used to signal the VFD controller to turn off or restrict the load if a high voltage ripple ratio is determined, and to limit the load of the VFD if an excessive voltage ripple ratio is determined. The DC monitoring system can also be used to combine these aspects. Firstly to limit the load, and secondly if a high voltage ripple ratio is determined at the lower load then the VFD is turned off.

The control module can be configured with a failure warning threshold for the voltage ripple ratio. In some embodiments, a voltage ripple ratio of 2.0% is set as the failure warning threshold. If at any given time the calculated voltage ripple ratio is 2.0% or higher, a warning signal is triggered by the control module. The triggered warning signal can initiate a local alarm, such as an alarm sounded by the PQube monitoring device or another device locally connected to the PQube monitoring device, or a remote alarm, such as a device remotely connected to the PQube monitoring device by a communications network. The PQube monitoring device can also take a 'snapshot' of all the waveforms during the event and store them locally, and if connected to a computer network with access to email, the PQube monitoring device will email, or otherwise communicate, the digital snapshot to the required personnel. The Applicant has found that a voltage ripple ratio of 2.0% or higher provides an effective predictor for near-term DC bus capacitor failure, and a failure warning threshold set at a voltage ripple ratio of 2.0% provides an effective early warning system. It is understood that the failure warning threshold can be set at a different voltage ripple ratio than 2.0%. Although use of the voltage ripple ratio is intended to normalize early warning failure triggers characterized by the voltage ripple measurements across different applications, the failure warning threshold can be set at different levels for different applications, as generalized or customized as desired. For example, a certain type of motor and/or VFD, or motor and VFD combination, may have one failure warning threshold value, while another type of motor and/or VFD, or another motor and VFD combination, may have a different failure warning threshold. In some embodiments, in addition to or in place of triggering an alarm, the warning signal can be used to automatically turn off or place in standby the VFD and/or the motor.

Another predictor of possible DC bus capacitor failure can be applied to VFDs having multiple DC buses by comparing determined voltage ripple characteristics between various ones or all of the DC buses. In some embodiments, it is the voltage ripple ratio for each DC bus that is compared from one DC bus to another. In other embodiments, it is the voltage ripple value, such as the RMS voltage ripple value, for each DC bus that is compared from one DC bus to another. A VFD with multiple DC buses is configured for balanced load, which translates to equal voltage ripple ratios or voltage ripple values across each DC bus. If the determined voltage ripple characteristic, such as the voltage ripple ratio or the voltage ripple value, is different across one or more DC buses compared to the other DC buses, then an unbalanced condition exists. The unbalanced condition can be a predictor of a potential DC bus capacitor failure and provides justification for generating a warning signal. Control logic, either in the PQube monitoring device or an electronic device remotely connected to the PQube monitoring device, is configured with programmed logic and memory for making such comparisons and generating appropriate warning signals. By way of example, consider the VFD of FIG. 4 that has six DC buses. Consider that the voltage ripple characteristic to be measured and compared is the voltage ripple ratio for each DC bus. The voltage ripple ratio for DC bus 1 is referred to as A, the voltage ripple ratio DC bus 2 is referred to as A−, the voltage ripple ratio for DC bus 3 is referred to as B, the voltage ripple ratio for DC bus 4 is referred to as B−, the voltage ripple ratio for DC bus 5 is referred to as C, and the voltage ripple ratio for DC bus 6 is referred to as C−. The comparison logic can be as follows:

Compare A to A−
Expected result of A+(A−)=0
Else unbalanced and early warning signal generated.
Similarly, compare B to B− and C to C−.

Different comparison logic can be used as an alternative or addition to the above comparison logic. For example:

Compare all six values A, A−, B, B−, C, C− to each other
Expected result A+(A−)+B+(B−)+C+(C−)=0
Else further diagnostics are required.
Additional diagnostics may include:
Compare A to B
Expected result A−B=0
Else unbalanced and early warning signal generated.
Similarly compare A to C and B to C.
Similarly compare A−, B− and C−

Unbalance across DC buses may occur due to an unbalance in the input three-phase AC voltage, this must be considered as part of the additional diagnostics.

EXAMPLE

The following example shows actual results performed in a low voltage environment for a single DC bus configuration. This test was in a low voltage environment for safety reasons as it is too dangerous to perform this test in a medium voltage environment. The tests results provide a useful basis for evaluation a multiple bus configuration in a medium voltage environment since individual buses in a multiple bus configuration have similar data points as the single bus test results shown below.

A 200 Hp VFD is selected to represent a common drive size. The VFD is connected to a 480V, 60 Hz input power source on R, S, and T terminals of the VFD. The outputs (U, V, and W) of the VFD are connected to a 200 Hp rotating load. The VFD has eight 8200 uF capacitors connected in groups of two serially connected, and in a bank of 4 parallel pairs. This results in a total capacitance of 16400 uF.

The following test steps are followed, and the data recorded. After each step the drive is powered down and the capacitor bank allowed to discharge before making modifications to the DC bus (removing of capacitance). All electrical data including the DC bus status is recorded in a Power Standards Lab PQube 3 (PQube monitoring device) with a 1000V Attenuator module for the DC measurements. The test steps include:
1) Start the VFD and load up to full load (240 A to the motor).
2) Capture the following data:
   a. All AC (voltage ripple) parameters, V, A, Hz, PF
   b. Harmonics
   c. DC bus average and peak ripple
3) Power down the VFD
4) Remove approximately 25% of the capacitance from the DC bus
5) Power up the VFD
6) Return to full load
7) Capture data
8) Repeat Note: The test was stopped by the VFD technician, who indicated the remaining capacitors where hot and likely to explode if the test continued. This occurred with about 18% capacitance remaining. Although the preceding procedure is shown in the context of a low voltage environment, the same procedure can be applied in a medium voltage environment having multiple buses.

Figure 17:
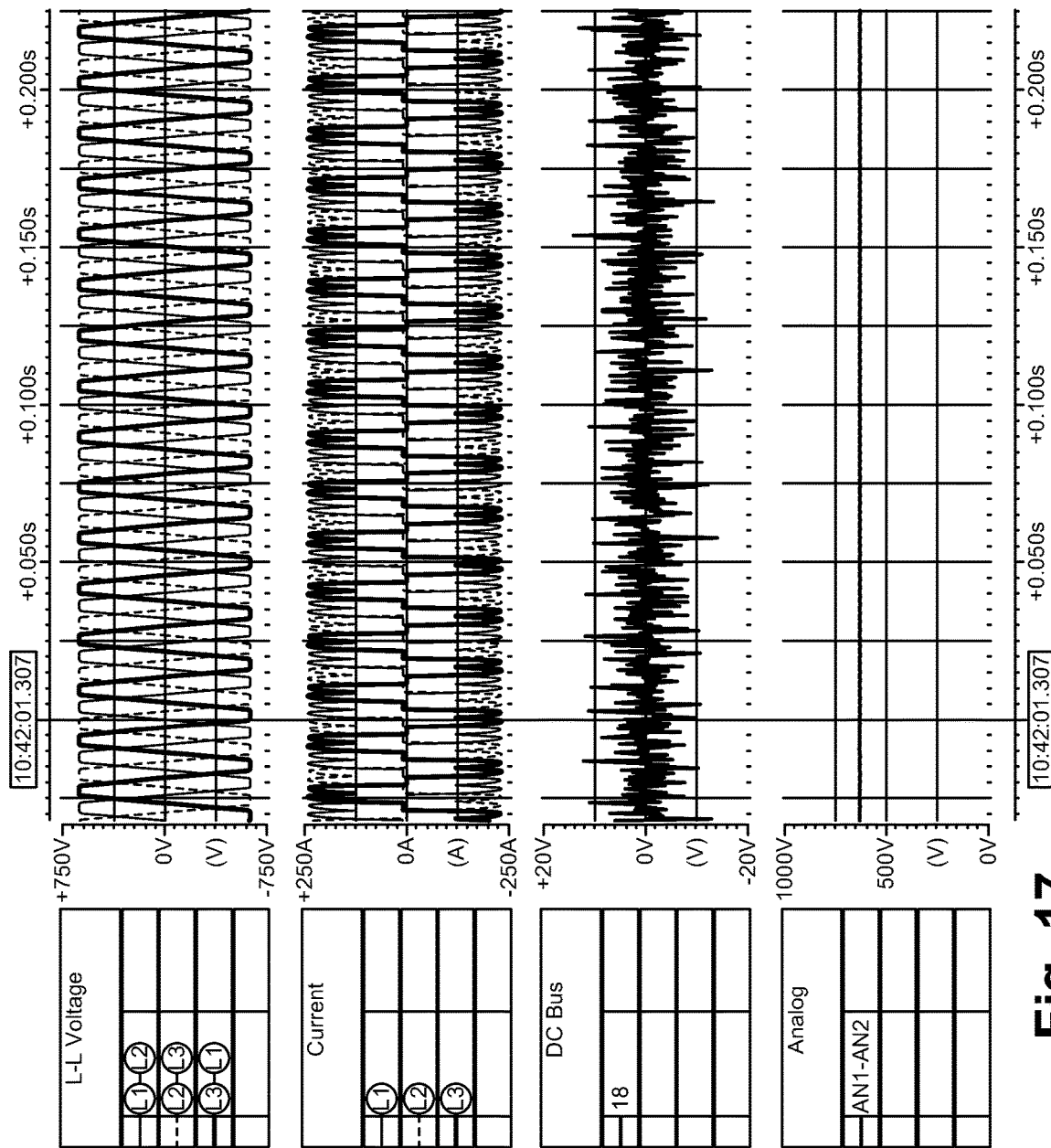
FIG. 17 illustrates the resulting waveforms from the example test above where the capacitance is 16400 uF.

The following results correspond to the load being driven at full load. FIG. 17 illustrates the resulting waveforms from the example test above where the capacitance is 16400 uF. A capacitance value of 16400 uF corresponds to a "new capacitor" condition. The first (top) waveform shows the low voltage three-phase AC voltage waveform across a secondary winding of the transformer. The second waveform shows the current input into the VFD. The third waveform shows the voltage ripple waveform as measured at the DC bus. The fourth (bottom) waveform shows the rectified low voltage three-phase DC voltage waveform, the same as shown in FIG. 7.

Figure 18:
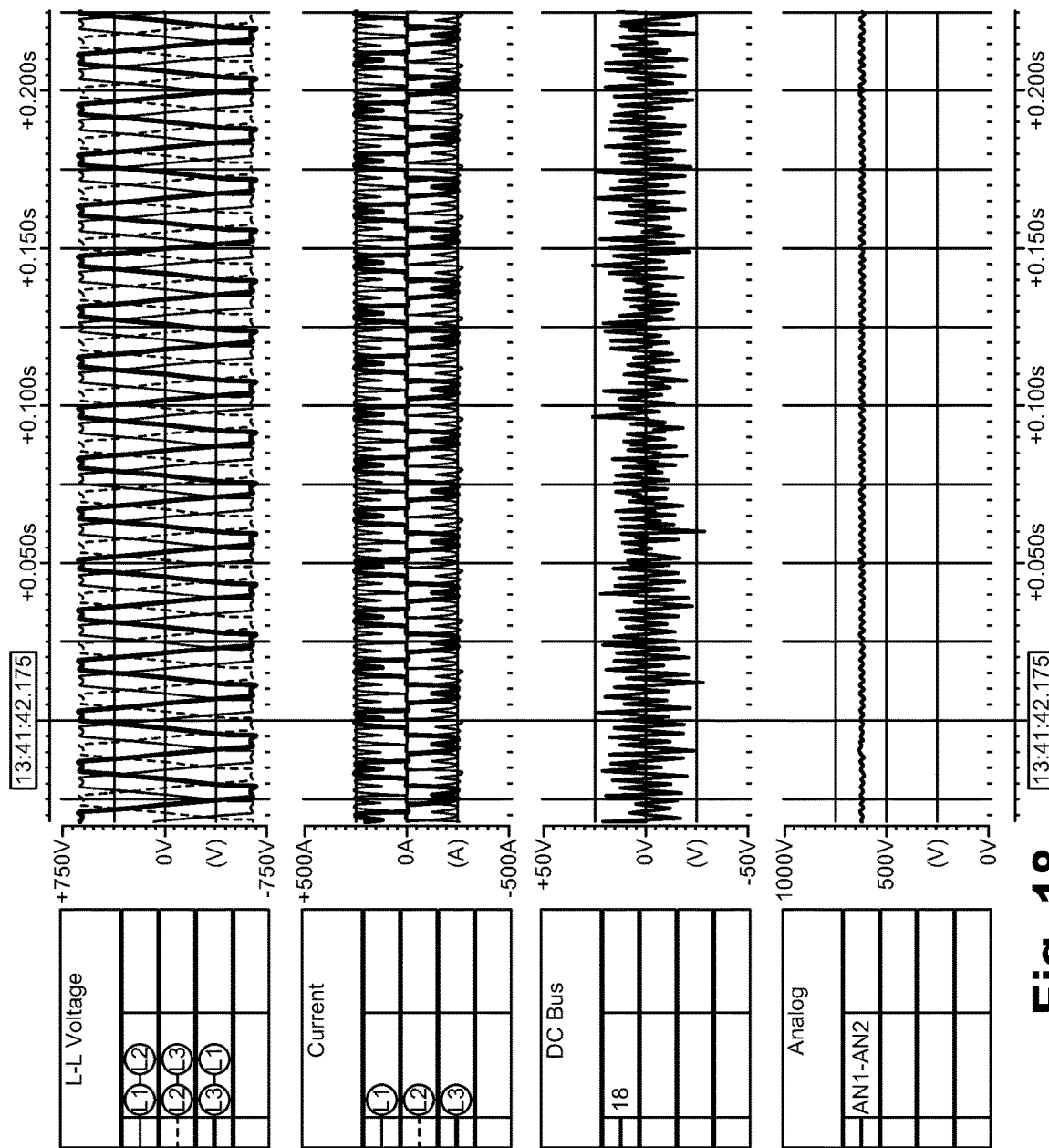
FIG. 18 illustrates the resulting waveforms from the example test above where the capacitance is 2300 uF.

FIG. 18 illustrates the resulting waveforms from the example test above where the capacitance is 2300 uF. A capacitance value of 2300 uF corresponds to an "old capacitor" condition.

Table 4 below shows resultant calculations for the average DC voltage, the RMS voltage ripple, and the voltage ripple ratio for various capacitance values tested.

TABLE 4

| Capacitance (uF) | 16400 | 12300 | 8200 | 4100 | 2300 |
|---|---|---|---|---|---|
| RMS voltage ripple (V) | 6.25 | 6.87 | 7.07 | 10.15 | 12.73 |
| average DC voltage (V) | 623.03 | 621.90 | 622.47 | 622.20 | 621.27 |
| voltage ripple ratio | 1.02% | 1.11% | 1.14% | 1.65% | 2.12% |

Figure 19:
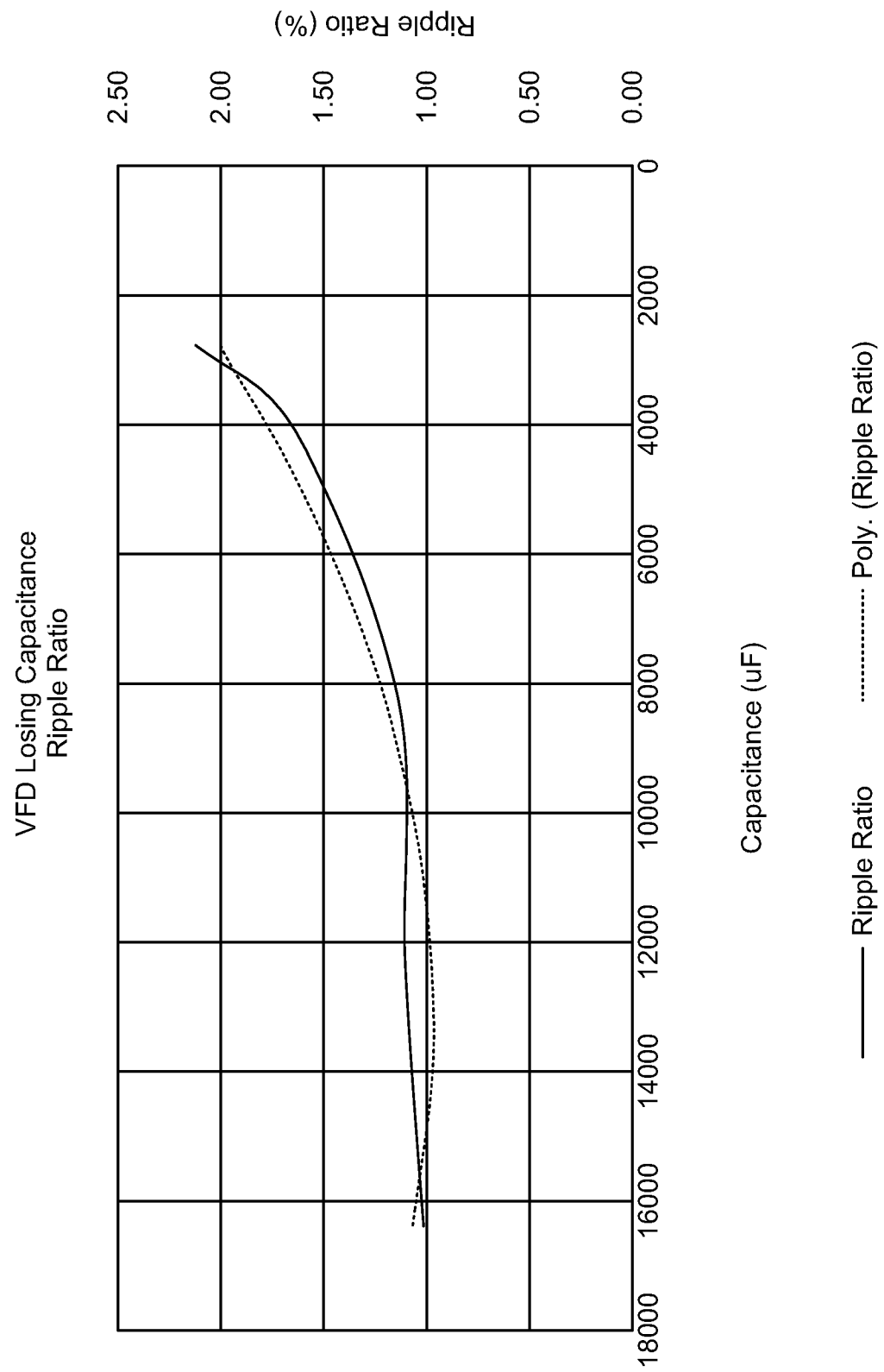
FIG. 19 illustrates a graph of test results comparing capacitance versus voltage ripple ratio.

FIG. 19 illustrates a graph of test results comparing capacitance versus voltage ripple ratio. The solid line represents the voltage ripple ratio determined using the digital filtering processes described above. The dashed line represents the voltage ripple ratio calculated using an appropriate polynomial equation. Table 4 and the graph of FIG. 19 indicate how the voltage ripple ratio increases with loss of capacitance. More particularly, the voltage ripple ratio remains slightly above 1% until the capacitance is reduced to 8000 uF. After this point the voltage ripple ratio increases rapidly as more capacitors are removed, which corresponds to reduced capacitance value. By the time the voltage ripple ratio reached 2%, the technician indicated the remaining capacitors were getting hot, and on his recommendation the test was concluded.

The present application has been described in terms of specific embodiments incorporating details to facilitate the understanding of the principles of construction and operation of the DC monitoring system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A system to determine failure in a variable frequency drive, the system comprising:
   a. the variable frequency drive comprising a DC bus; and
   b. a measurement device coupled to the DC bus, wherein the measurement device is configured to measure a voltage waveform of the DC bus and to process the measured voltage waveform to determine a voltage ripple ratio, wherein the voltage ripple ratio comprises a second filtered value divided by a first filtered value, the first filtered value is a DC voltage value of the measured voltage value and the second filtered value is a voltage ripple value of the measured voltage value, wherein the measurement device is further configured to compare the voltage ripple ratio to a threshold value, and to generate a warning signal if the voltage ripple ratio is equal to or greater than the threshold value.

2. The system of claim 1 wherein the DC voltage value is an average value of the measured voltage waveform over a defined period of time.

3. The system of claim 1 wherein the DC voltage value is a root mean square value of the measured voltage waveform over a defined period of time.

4. The system of claim 1 wherein the DC voltage value is a peak value of the measured voltage waveform over a defined period of time.

5. The system of claim 1 wherein the measured voltage waveform includes a voltage ripple waveform component, and the voltage ripple value is a root mean square of the voltage ripple waveform component over a defined period of time.

6. The system of claim 1 wherein the measured voltage waveform includes a voltage ripple waveform component, and the voltage ripple value is an average of the voltage ripple waveform component over a defined period of time.

7. The system of claim 1 wherein the measured voltage waveform includes a voltage ripple waveform component, and the voltage ripple value is a peak value of the voltage ripple waveform component over a defined period of time.

8. The system of claim 1 wherein the measured voltage waveform comprises an AC voltage component and a DC voltage component, and the voltage ripple value is representative of the AC voltage component and the DC voltage value is representative of the DC voltage component.

9. The system of claim 1 wherein the variable frequency drive is a medium voltage variable frequency drive configured to receive an input medium voltage.

10. The system of claim 9 wherein the medium voltage comprises a voltage value in the range of 2001 VAC to 35,000 VAC.

11. The system of claim 9 wherein the medium voltage comprises a voltage value in the range of 0 to 2000 VAC.

12. The system of claim 1 wherein the variable frequency drive is a low voltage variable frequency drive configured to receive as input a low voltage.

13. The system of claim 1 wherein the DC bus comprises a filtering capacitor, and the warning signal indicates upcoming capacitance failure of the filtering capacitor.

14. A system to determine failure in a variable frequency drive, the system comprising:
 a. a variable frequency drive comprising a plurality of DC buses;
 b. a plurality of measurement devices, one measurement device coupled to one of the plurality of DC buses, wherein each measurement device is configured to measure a voltage waveform of the corresponding DC bus; and
 c. a PQube measurement device coupled to the plurality of measurement devices to receive data signals representative of the measured voltage waveforms, wherein the PQube measurement device is configured to process the measured voltage waveform to determine a voltage ripple ratio for each DC bus, wherein the voltage ripple ratio comprises a second filtered value divided by a first filtered value, the first filtered value is a DC voltage value of the measured voltage waveform and the second filtered value is a voltage ripple value of the measured voltage waveform, wherein the PQube measurement device is further configured to compare the voltage ripple ratio for each DC bus to a threshold value, and to generate a warning signal if the voltage ripple ratio is equal to or greater than the threshold value.

15. The system of claim 14 wherein the DC voltage value is an average value of the measured voltage waveform over a defined period of time.

16. The system of claim 14 wherein the DC voltage value is a root mean square value of the measured voltage waveform over a defined period of time.

17. The system of claim 14 wherein the DC voltage value is a peak value of the measured voltage waveform over a defined period of time.

18. The system of claim 14 wherein the measured voltage waveform includes a voltage ripple waveform component, and the voltage ripple value is a root mean square of the voltage ripple waveform component over a defined period of time.

19. The system of claim 14 wherein the measured voltage waveform includes a voltage ripple waveform component, and the voltage ripple value is an average of the voltage ripple waveform component over a defined period of time.

20. The system of claim 14 wherein the measured voltage waveform includes a voltage ripple waveform component, and the voltage ripple value is a peak value of the voltage ripple waveform component over a defined period of time.

21. The system of claim 14 wherein the measured voltage waveform comprises an AC voltage component and a DC voltage component, and the voltage ripple value is representative of the AC voltage component and the DC voltage value is representative of the DC voltage component.

22. The system of claim 14 wherein the variable frequency drive is a medium voltage variable frequency drive configured to receive as input a medium voltage.

23. The system of claim 22 wherein the medium voltage comprises a voltage value in the range of 2001 VAC to 35,000 VAC.

24. The system of claim 22 wherein each DC bus has a low voltage.

25. The system of claim 24 wherein the low voltage comprises a voltage value in the range of 0 to 2000 VAC.

26. The system of claim 14 wherein the DC bus comprises a filtering capacitor, and the warning signal indicates upcoming capacitance failure of the filtering capacitor.

27. The system of claim 14 wherein the PQube measurement device is further configured to compare the voltage ripple value component of each DC bus to the voltage ripple value component of one or more other DC buses, and if the voltage ripple value components are not equal then the warning signal is generated.

* * * * *